US009825631B1

(12) United States Patent
Cho et al.

(10) Patent No.: US 9,825,631 B1
(45) Date of Patent: Nov. 21, 2017

(54) IMPEDANCE CALIBRATION CIRCUIT OF SEMICONDUCTOR MEMORY DEVICE, SEMICONDUCTOR MEMORY DEVICE AND METHOD OF OPERATING THE SAME

(71) Applicant: SAMSUNG ELECTRONICS CO., LTD., Suwon-si, Gyeonggi-do (KR)

(72) Inventors: Seok-Jin Cho, Seoul (KR); Tae-Young Oh, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/390,851

(22) Filed: Dec. 27, 2016

(30) Foreign Application Priority Data

May 11, 2016 (KR) .......................... 10-2016-0057437

(51) Int. Cl.
| | | |
|---|---|---|
| H03K 17/16 | (2006.01) | |
| H03K 19/003 | (2006.01) | |
| H03K 19/00 | (2006.01) | |
| G11C 5/14 | (2006.01) | |
| G11C 7/10 | (2006.01) | |

(52) U.S. Cl.
CPC ......... *H03K 19/0005* (2013.01); *G11C 5/147* (2013.01); *G11C 7/10* (2013.01)

(58) Field of Classification Search
CPC ....... H03K 19/0005; G11C 5/147; G11C 7/10
USPC ...................................... 326/30; 365/189.05
See application file for complete search history.

(56) References Cited

U.S. PATENT DOCUMENTS

| | | | |
|---|---|---|---|
| 7,710,143 B2 | 5/2010 | Jeong et al. | |
| 8,553,471 B2 | 10/2013 | Kim et al. | |
| 8,610,458 B2 | 12/2013 | Lee | |
| 9,077,332 B2 | 7/2015 | Ko | |
| 9,118,313 B2 | 8/2015 | Lee et al. | |
| 9,197,209 B2 | 11/2015 | Cho et al. | |
| 2003/0231523 A1* | 12/2003 | Cho .................. | G11C 16/06 365/189.05 |
| 2009/0009213 A1* | 1/2009 | Osanai ............... | H03K 19/0005 326/30 |
| 2012/0056641 A1* | 3/2012 | Kuroki .......... | H03K 19/017545 326/30 |
| 2015/0063041 A1 | 3/2015 | Arai | |
| 2015/0115999 A1 | 4/2015 | Lee | |
| 2015/0340069 A1 | 11/2015 | Arai et al. | |
| 2015/0348603 A1 | 12/2015 | Lee et al. | |
| 2016/0012879 A1 | 1/2016 | Eom et al. | |

* cited by examiner

*Primary Examiner* — Daniel D Chang
(74) *Attorney, Agent, or Firm* — Volentine & Whitt, PLLC

(57) ABSTRACT

An impedance calibration circuit includes a first code generator, a first code storing circuit, a second code generator and a second code storing circuit. The first code generator generates a pull-up control code obtained from a result of comparing a target output high level (VOH) voltage with a first voltage of a first node. The first code storing circuit stores the pull-up control code when the target VOH voltage becomes the same as the first voltage. The second code generator generates a pull-down control code obtained from a result of comparing the VOH voltage with a second voltage of a second node. The second storing circuit stores the pull-down control code when the target VOH voltage becomes the same as the second voltage. The first code storing circuit and the second code storing circuit store pull-up control code and pull-down control code pairs respectively.

20 Claims, 19 Drawing Sheets

IMPEDANCE CALIBRATION CIRCUIT OF SEMICONDUCTOR MEMORY DEVICE, SEMICONDUCTOR MEMORY DEVICE AND METHOD OF OPERATING THE SAME

CROSS-REFERENCE TO RELATED APPLICATION

A claim for priority under 35 U.S.C. §119 is made to Korean Patent Application No. 10-2016-0057437, filed on May 11, 2016 in the Korean Intellectual Property Office, the disclosure of which is incorporated herein in its entirety by reference.

BACKGROUND

The inventive concepts described herein relate to memory devices, and more particularly to an impedance calibration circuit of a semiconductor memory device, a semiconductor memory device and a method of operating a semiconductor memory device.

As the operating speed of semiconductor memory devices has increased, swing width of signals interfaced between a semiconductor memory device and a memory controller has generally decreased. However, as swing width has decreased, signals transferred between a semiconductor memory device and a memory controller may be more easily distorted by impedance mismatch caused by process, voltage and temperature (PVT) variations. An impedance calibration operation for adjusting an output impedance and/or a termination impedance of a semiconductor memory device may be employed at transmitting and/or receiving stages of the semiconductor memory device. During the impedance calibration operation, the output impedance and/or the termination impedance may be adjusted by comparing the output impedance and/or the termination impedance with an impedance of an external resistor. The impedance calibration operation may be referred to as an input/output (I/O) offset cancellation operation or a ZQ calibration operation.

SUMMARY

Embodiments of the inventive concept provide an impedance calibration circuit of a semiconductor memory device, capable of enhancing signal integrity.

Embodiments of the inventive concept further provide a semiconductor memory device including the impedance calibration circuit, capable of enhancing signal integrity.

Still further embodiments of the inventive concept provide a method of operating a semiconductor memory device, capable of enhancing signal integrity.

According to embodiments of the inventive concept, an impedance calibration circuit of a semiconductor memory device includes a first code generator, a first code storing circuit, a second code generator and a second code storing circuit. The first code generator generates a pull-up control code obtained from a result of comparing a target output high level (VOH) voltage with a first voltage at a first node between a pull-up driver and a first replica pull-down driver. The first code storing circuit stores the pull-up control code when the target VOH voltage becomes the same as the first voltage. The second code generator generates a pull-down control code obtained from a result of comparing the target VOH voltage with a second voltage at a second node connected to a ZQ pad, the ZQ pad being connected to an external resistor. The second storing circuit stores the pull-down control code when the target VOH voltage becomes the same as the second voltage. The first code string circuit and the second code storing circuit respectively store a first pull-up control code as the pull-up control code and a first pull-down control code as the pull-down control code, and respectively store a second pull-up control code as the pull-up control code and a second pull-down control code as the pull-down control code when the semiconductor memory device operates with a first frequency. The first pull-up control code and the first pull-down control code are associated with a first operating parameter of the semiconductor memory device. The second pull-up control code and the second pull-down control code are associated with a second operating parameter of the semiconductor memory device.

According to embodiments of the inventive concept, a semiconductor memory device includes a control logic circuit, an impedance calibration circuit and a data output circuit. The control logic circuit generates an impedance calibration enable signal and a mode register set signal by decoding a command from an external memory controller. The impedance calibration circuit generates pull-up control codes and pull-down control codes for different target output high level (VOH) voltages and stores the pull-up control codes and the pull-down control codes, in response to the mode register set signal during an impedance calibration interval based on the impedance calibration enable signal. The data output circuit outputs a data signal by driving data based on a first pull-up control code from among the pull-up control codes and a first pull-down control code from among the pull-down control codes while the semiconductor memory device is operating with a first frequency, and outputs the data signal by driving the data based on a second pull-up control code from among the pull-up control codes and a second pull-down control code from among the pull-down control codes while the semiconductor memory device is operating with a second frequency different from the first frequency.

According to embodiments of the inventive concept, a method of operating a semiconductor memory device includes storing a first pull-up control code and a first pull-down control code by performing an impedance calibration operation on a first target voltage during an impedance calibration interval based on an externally provided command; storing a second pull-up control code and a second pull-down control code by performing an impedance calibration operation on a second target voltage during the impedance calibration interval; outputting a data signal based on the first pull-up control code and the first pull-down control code while the semiconductor memory device is operating with a first frequency; changing an operating frequency of the semiconductor memory device from the first frequency to a second frequency by performing a mode register write operation in the semiconductor memory device; and outputting the data signal based on the second pull-up control code and the second pull-down control code while the semiconductor memory device is operating with the second frequency.

Accordingly, the impedance calibration circuit may perform an impedance calibration operation for at least two target VOH voltages, store pull-up control code and pull-down control code pairs during an impedance calibration interval and output a data signal using the stored code pairs without performing the impedance calibration operation during a normal memory operation interval. Therefore, the semiconductor memory device may increase operating speed and may enhance signal integrity.

BRIEF DESCRIPTION OF THE DRAWINGS

Embodiments of the inventive concept will be more clearly understood from the following detailed description taken in conjunction with the accompanying drawings, wherein like reference numerals refer to like parts throughout the various figures unless otherwise specified.

DETAILED DESCRIPTION OF THE EMBODIMENTS

Various exemplary embodiments will be described more fully hereinafter with reference to the accompanying drawings, in which some exemplary embodiments are shown.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
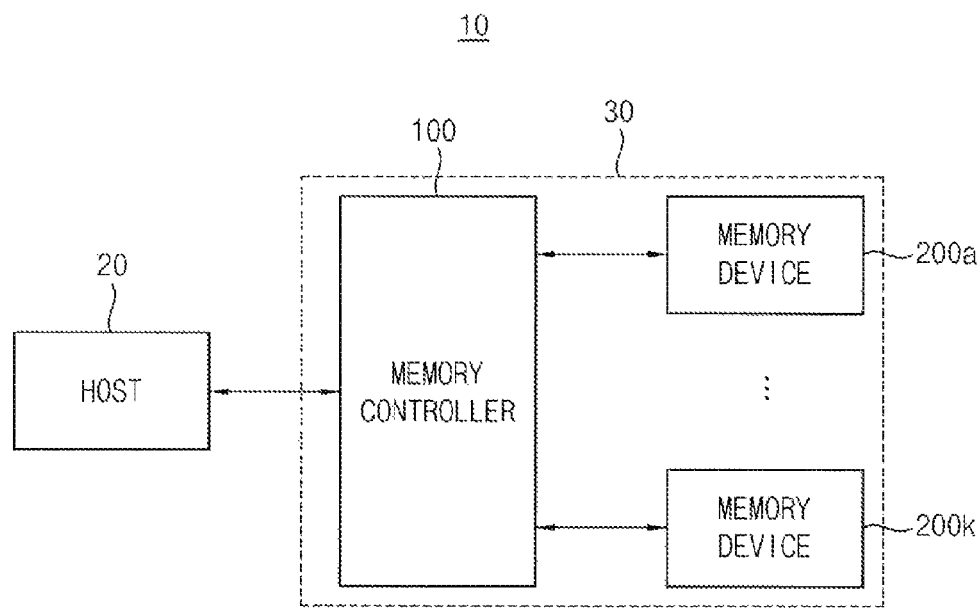
FIG. 1 illustrates a block diagram of an electronic system according to embodiments of the inventive concept.

FIG. 1 illustrates a block diagram of an electronic system according to embodiments of the inventive concept.

Referring to FIG. 1, electronic system 10 includes a host 20 and a memory system 30. The memory system 30 includes a memory controller 100 and a plurality of semiconductor memory devices 200a~200k.

The host 20 may communicate with the memory system 30 through various interface protocols such as for example Peripheral Component Interconnect-Express (PCI-E), Advanced Technology Attachment (ATA), Serial ATA (SATA), Parallel ATA (PATA), serial attached SCSI (SAS), or the like. In addition, the host 20 may also communicate with the memory system 30 through interface protocols such as for example Universal Serial Bus (USB), Multi-Media Card (MMC), Enhanced Small Disk Interface (ESDI), Integrated Drive Electronics (IDE) or the like.

The memory controller 100 may control an overall operation of the memory system 30. The memory controller 100 may control an overall data exchange between the host 20 and the plurality of semiconductor memory devices 200a~200k. For example, the memory controller 100 may write data in the plurality of semiconductor memory devices 200a~200k or read data from the plurality of semiconductor memory devices 200a~200k, in response to request from the host 20.

In addition, the memory controller 100 may issue operation commands to the plurality of semiconductor memory devices 200a~200k for controlling the plurality of semiconductor memory devices 200a~200k.

In some embodiments, each of the plurality of semiconductor memory devices 200a~200k may be dynamic random access memory (DRAM), such as for example double data rate synchronous dynamic random access memory (DDR SDRAM), low power double data rate synchronous dynamic random access memory (LPDDR SDRAM), graphics double data rate synchronous dynamic random access memory (GDDR SDRAM), Rambus dynamic random access memory (RDRAM), or the like.

In some embodiments, each of the plurality of semiconductor memory devices 200a~200k may be a resistive type of memory device such as for example Magnetic RAM (MRAM), Phase change RAM (PRAM) and Resistive RAM (RRAM).

Figure 2:
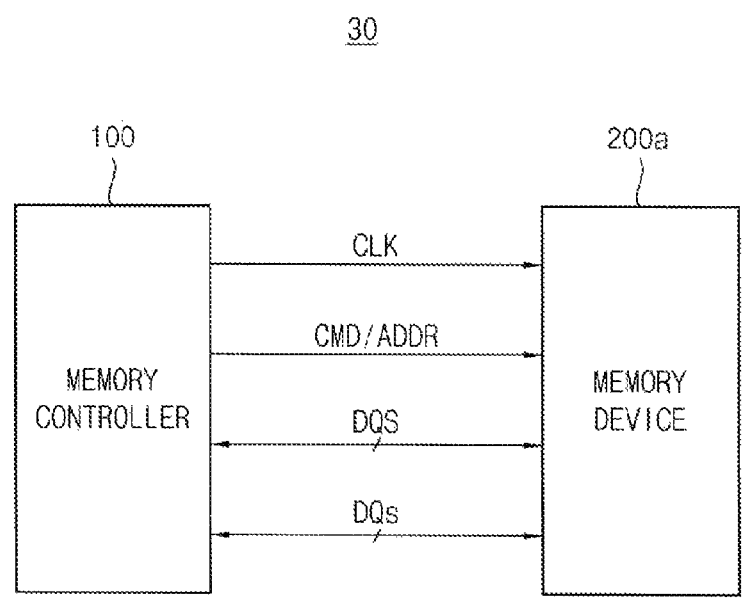
FIG. 2 illustrates a block diagram of an example of the memory system in FIG. 1 according to embodiments of the inventive concept.

FIG. 2 illustrates a block diagram of an example of the memory system in FIG. 1 according to embodiments of the inventive concept.

In FIG. 2, for convenience and simplicity, only one semiconductor memory device 200a is illustrated in communication with the memory controller 100. However, the details discussed herein related to semiconductor memory device 200a may equally apply to the other semiconductor memory devices 200b~200k shown in FIG. 1.

Referring to FIG. 2, the memory system 30 includes the memory controller 100 and the semiconductor memory device 200a. The memory controller 100 transmits to the semiconductor memory device 200a control signals such as a clock signal CLK, a command CMD, an address ADDR, data strobe signals DQS and data signals DQs. Memory controller 100 also receives the data signals DQs and the data strobe signals DQS from the semiconductor memory device 200a.

The memory controller 100 may transmit a write command, a read command, an impedance calibration command to the semiconductor memory device 200a. The semiconductor memory device 200a may perform a write operation in response to a write command, a read operation in response to a read command, and an impedance calibration operation in response to an impedance calibration command.

Figure 3:
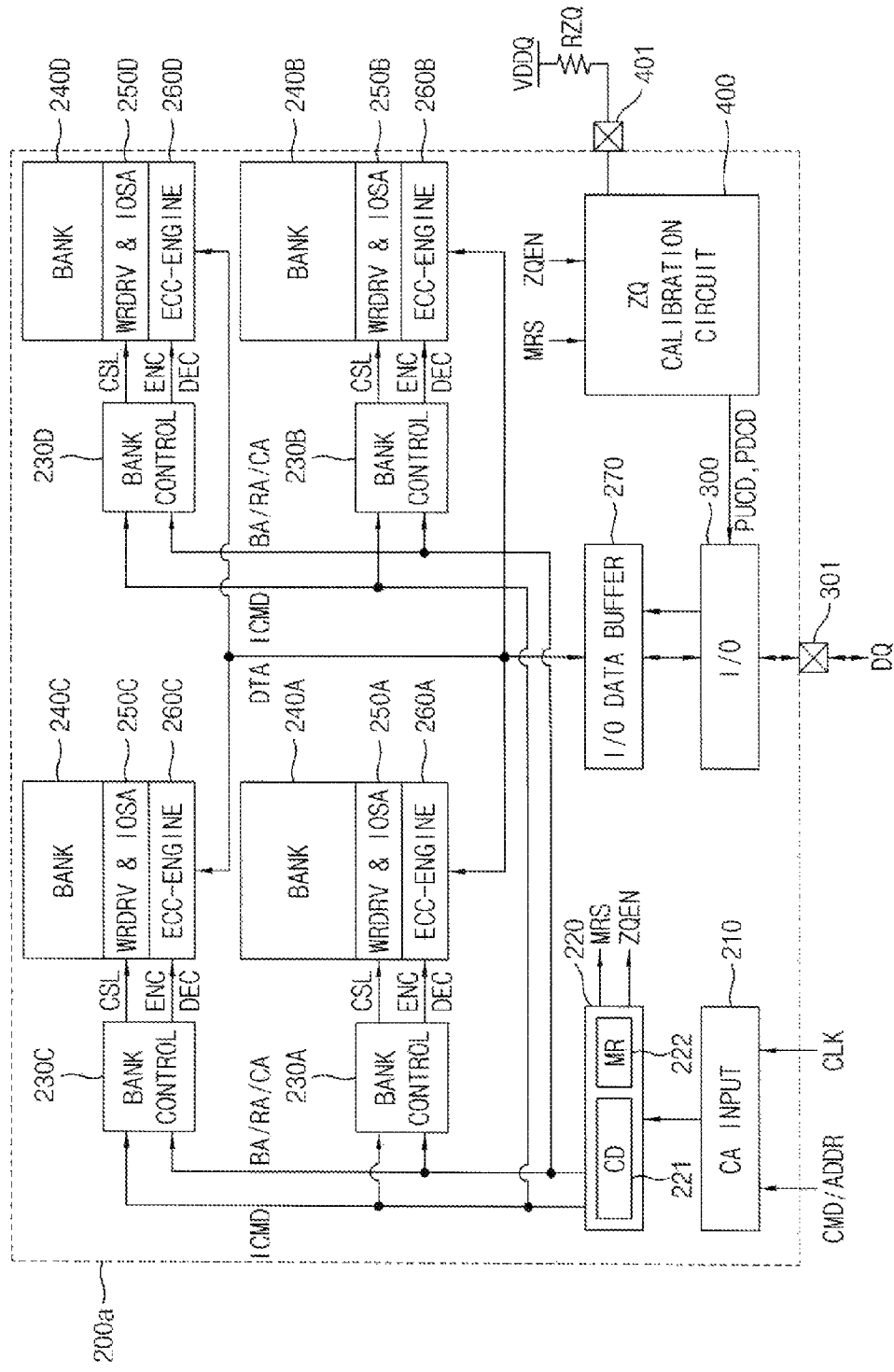
FIG. 3 illustrates a block diagram of an example of the semiconductor memory device in FIG. 2 according to embodiments of the inventive concept.

FIG. 3 illustrates a block diagram of an example of the semiconductor memory device in FIG. 2 according to embodiments of the inventive concept.

Referring to FIG. 3, the semiconductor memory device 200a includes a command/address input buffer (CA Input) 210, a control logic circuit 220, bank control logics (Bank Control) 230A~230D, a memory cell array (Bank) 240A~240D, write driver and data input/output (I/O) sense amplifiers (WRDRV & IOSA) 250A~250D, error correction code (ECC) engines 260A~260D, an I/O data buffer 270, an I/O circuit 300 and an impedance calibration circuit (ZQ Calibration Circuit) 400.

The memory cell array 240A~240D may include first through fourth bank arrays 240A~240D, respectively, in which a plurality of memory cells are arrayed in rows and columns. A row decoder and a column decoder (not shown) for selecting word-lines and bit-lines that are connected to the memory cells may be connected to each of the first through fourth bank arrays 240A~240D. The row decoders and the column decoders may be disposed in the bank control logics 230A~230D. In the embodiment described with respect to FIG. 3, the semiconductor memory device 200a includes the four bank arrays 240A~240D, but in other embodiments the semiconductor memory device 200a may include any arbitrary number of banks.

The command/address input buffer 210 may receive a clock signal CLK, a command CMD, and an address ADDR from the memory controller 100. The command CMD and the address ADDR may be input via the same terminals, i.e., CA pads. The command CMD and the address ADDR may be sequentially input via the CA pads. The command CMD issued by the memory controller 100 may include a read command, a write command and an impedance calibration command. The read command indicates a read operation of the semiconductor memory device 200a, the write command indicates a write operation of the semiconductor memory device 200a, and the impedance calibration command indicates an impedance calibration operation of the semiconductor memory device 200a.

The control logic circuit 220 may receive the command CMD and the address ADDR via the command/address input buffer 210, and may generate an internal command ICMD, a mode register set signal MRS, an impedance calibration enable signal ZQEN and an address signal (BA/RA/CA). The internal command ICMD may include an internal read command and an internal write command. The address signal may include a bank address BA, a row address RA, and a column address CA. The internal command ICMD and the address signal BA/RA/CA may be provided to each of the bank control logics 230A~230D. The control logic circuit 220 may control access to the memory cell array 240A~240D.

The control logic circuit 220 includes a command decoder (CD) 221 and a mode register (MR) 222. The command decoder 221 decodes the command CMD to generate the internal command ICMD and the mode register 222 may set an operation mode of the semiconductor memory device 200a based on the command CMD and the address ADDR. The mode register 222 may generate the mode register set signal MRS and the impedance calibration enable signal ZQEN based on the CMD and the address ADDR and may provide the mode register set signal MRS and the impedance calibration enable signal ZQEN to the impedance calibration circuit 400.

Each of the bank control logics 230A~230D may be activated responsive to corresponding bank addresses BA. The activated bank control logics 230A~230D may generate bank control signals in response to the internal command ICMD, the row address RA, and the column address CA. In response to the bank control signals, the row decoder and the column decoder corresponding to the first through fourth bank arrays 240A~240D that are connected to the activated bank control logics 230A~230D may be activated.

The row decoder corresponding to each of the first through fourth bank arrays 240A~240D may decode the row address RA and therefore may enable a word-line that corresponds to the row address RA. The column address CA provided for each of the first through fourth bank arrays 240A~240D may be temporarily stored in a column address latch (not shown). The column address latch may stepwise increase the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signals, each of the bank control logics 230A~230D may generate an ECC encoding signal ENC and an ECC decoding signal DEC for controlling operations of the ECC engines 260A~260D that are connected to the first through fourth bank arrays 240A~240D, respectively.

The write driver and data I/O sense amplifiers 250A~250D may sense and amplify a plurality of pieces of read data output from the first through fourth bank arrays 240A~240D, respectively, and may transmit a plurality of pieces of write data to be stored to the first through fourth bank arrays 240A~240D, respectively.

During a write operation, each of the ECC engines 260A~260D may generate parity bits by performing an ECC encoding operation on the plurality of pieces of write data to be stored in each of the first through fourth bank arrays 240A~240D, in response to ECC encoding signals ENC output from the respective bank control logics 230A~230D.

During a read operation, each of the ECC engines 260A~260D may perform an ECC decoding operation by using the plurality of pieces of data and parity bits that are read from each of the first through fourth bank arrays 240A~240D, in response to ECC decoding signals DEC output from the respective bank control logics 230A~230D, and therefore may detect and correct an error bit in the plurality of pieces of read data.

The I/O data buffer 270 may include circuits (not shown) for gating a plurality of pieces of data that are input to or output from the first through fourth bank arrays 240A~240D; read data latches for storing the plurality of pieces of data output from the first through fourth bank arrays 240A~240D; and write data latches for storing the plurality of pieces of data to be written into the first through fourth bank arrays 240A~240D.

The I/O data buffer 270 may convert parallel data bits that are output from the first through fourth bank arrays 240A~240D into serial data bits via the read data latches. The I/O data buffer 270 may convert a plurality of pieces of write data that are serially received into parallel data bits by using the write data latches.

The I/O circuit 300 may receive the serial data bits output from the I/O data buffer 270, may sequentially array the serial data bits as data bits that correspond to a burst length, and then may output together the data bits and the data strobe signal DQS to data I/O pads. The I/O circuit 300 may receive the data strobe signal DQS and the plurality of pieces of write data that correspond to the burst length and that are serially input via the data I/O pads from the memory controller 100. The I/O circuit unit 300 may provide, to the I/O data buffer 270, the plurality of pieces of serially input write data that correspond to the burst length.

The I/O circuit 300 may output the data signal DQ having a target output high level voltage (VOH) voltage to the memory controller 100 via a data I/O pad 301 by driving data bits based on a pull-up control code PUCD and a pull-down control code PDCD provided from the impedance control circuit 400.

The impedance calibration circuit 400 may be connected to an external resistor RZQ through a ZQ pad 401 and the external resistor RZQ may be coupled to a power supply voltage VDDQ. In some embodiments, the external resistor RZQ may be coupled to a ground voltage.

The impedance calibration circuit (also referred to as a ZQ calibration circuit) 400 may generate pull-up control codes PUCD and pull-down control codes PDCD for different target VOH voltages (for at least two VOH voltages) and store the pull-up control codes PUCD and the pull-down control codes PDCD, in response to the mode register set signal MRS during an impedance calibration interval based on the impedance calibration enable signal ZQEN and the mode register set signal MRS. The impedance calibration circuit 400 may output the pull-up control codes PUCD and the pull-down control codes PDCD to a data output circuit of the I/O circuit 300 in a normal operation interval of the semiconductor memory device 200a.

Figure 4:
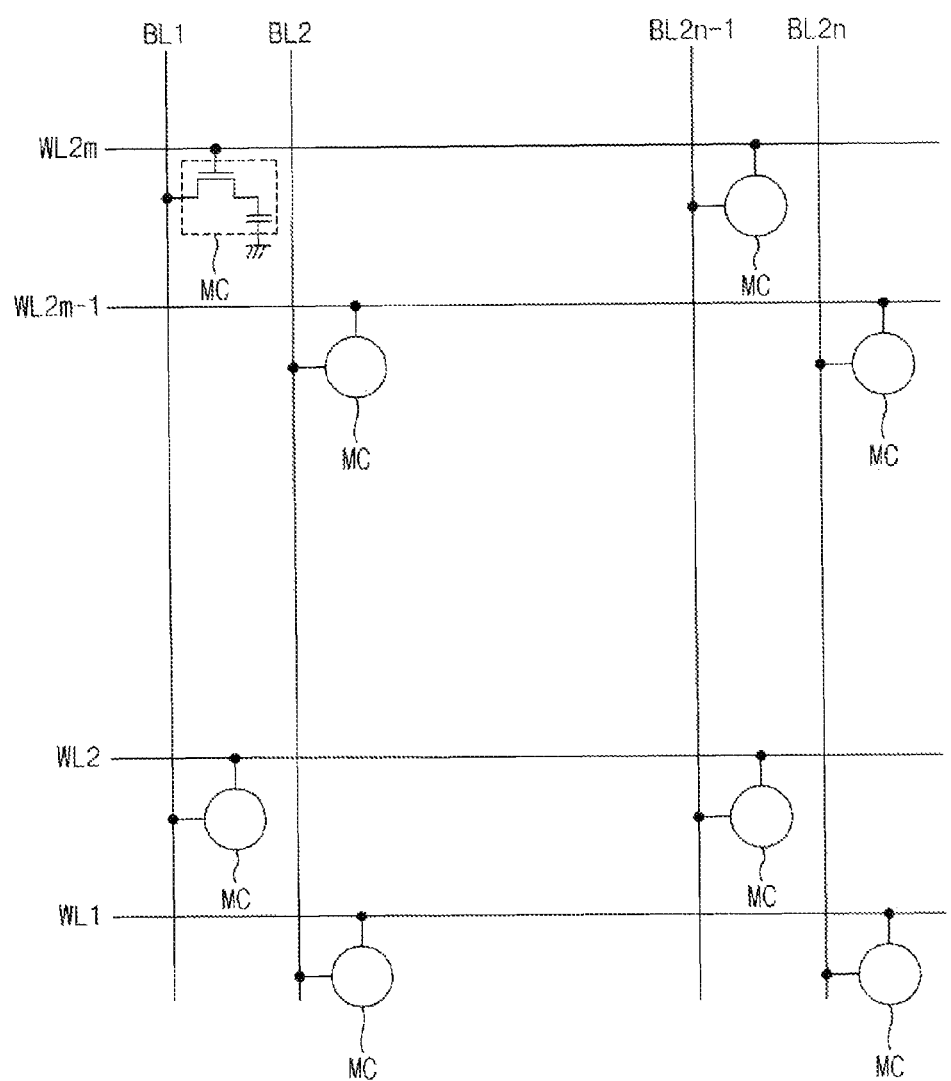
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 240A includes a plurality of word-lines WL1, WL2, WL2m−1 and WL2m (i.e., WL1~WL2m) where m is a natural number greater than two, a plurality of bit-lines BL1, BL2, BL2n−1 and BL2n (i.e., BL1~BL2n) where n is a natural number greater than two, and a plurality of memory cells MC disposed near intersections between the word-lines WL1~WL2m and the bit-lines BL1~BL2n. In some embodiments, each of the plurality of memory cells MC may include a dynamic random access memory (DRAM) cell structure. The plurality of word-lines WL1~WL2m to which the plurality of memory cells MC are connected may be defined as rows of the first bank array 240A and the plurality of bit-lines BL1~BL2n to which the plurality of memory cells MC are connected may be defined as columns of the first bank array 240A. In FIG. 4, m memory cells MC are coupled to a bit-line BL of the first bank array 240A and n memory cells MC are coupled to a word-line of the first bank array 240A. The second through fourth bank arrays 240B-240D may be configured similarly as the first bank array 240A.

Figure 5:
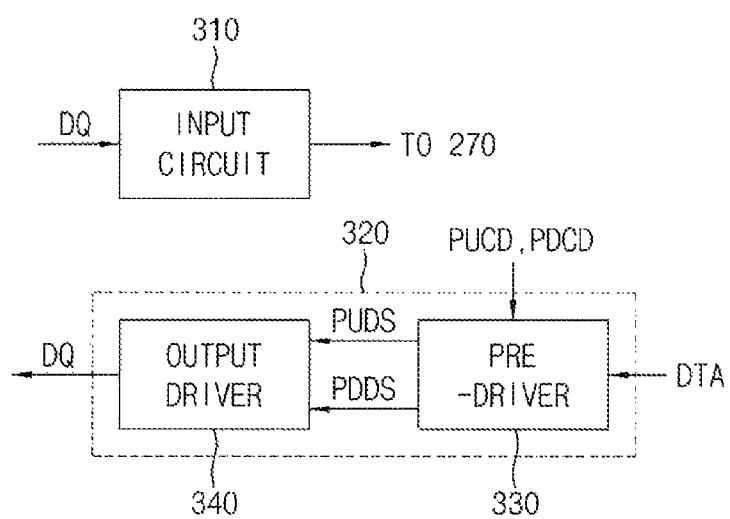
FIG. 5 illustrates an example of the I/O circuit in the semiconductor memory device of FIG. 3 according to embodiments of the inventive concept.

FIG. 5 illustrates an example of the I/O circuit in the semiconductor memory device of FIG. 3 according to embodiments of the inventive concept.

Referring to FIG. 5, the I/O circuit 300 includes a data input circuit 310 and a data output circuit 320. The data output circuit 320 includes a pre-driver 330 and an output driver 340.

The data input circuit 310 may receive the data signal DQ from the memory controller 100 and may provide the data signal DQ to the I/O data buffer 270. The data output circuit 320 may convert the data DTA from the I/O data buffer 270 to the data signal DQ and provide the data signal DQ to the memory controller 100.

The pre-driver 330 may receive the data DTA, generate a pull-up driving signal PUDS and a pull-down driving signal PDDS based on the pull-up control code PUCD and the pull-down control code PDCD and provide the pull-up driving signal PUDS and the pull-down driving signal PDDS to the output driver 340.

For example, when the data DTA is at a high level, the pre-driver 330 may buffer the pull-up control code PUCD and generate the pull-up driving signal PUDS to be the same as the pull-up control code PUCD, and generate the pull-down driving signal PDDS for turning off all transistors included in a pull-down driver (such as pull-down driver 343 shown in FIG. 6) of the output driver 340.

Contrarily, when the data DTA is at a low level, the pre-driver 330 may buffer the pull-down control code PDCD and generate the pull-down driving signal PDDS to be the same as the pull-down control code PDCD, and generate the pull-up driving signal PUDS for turning off all transistors included in a pull-up driver (such as pull-up driver 341 shown in FIG. 6) of the output driver 340.

In other words, the pre-driver 330 may determine a current generated by the pull-up driver 341 and a resistance of the pull-down driver 343 (shown in FIG. 6) when the output driver 340 outputs the data signal DQ.

Figure 6:
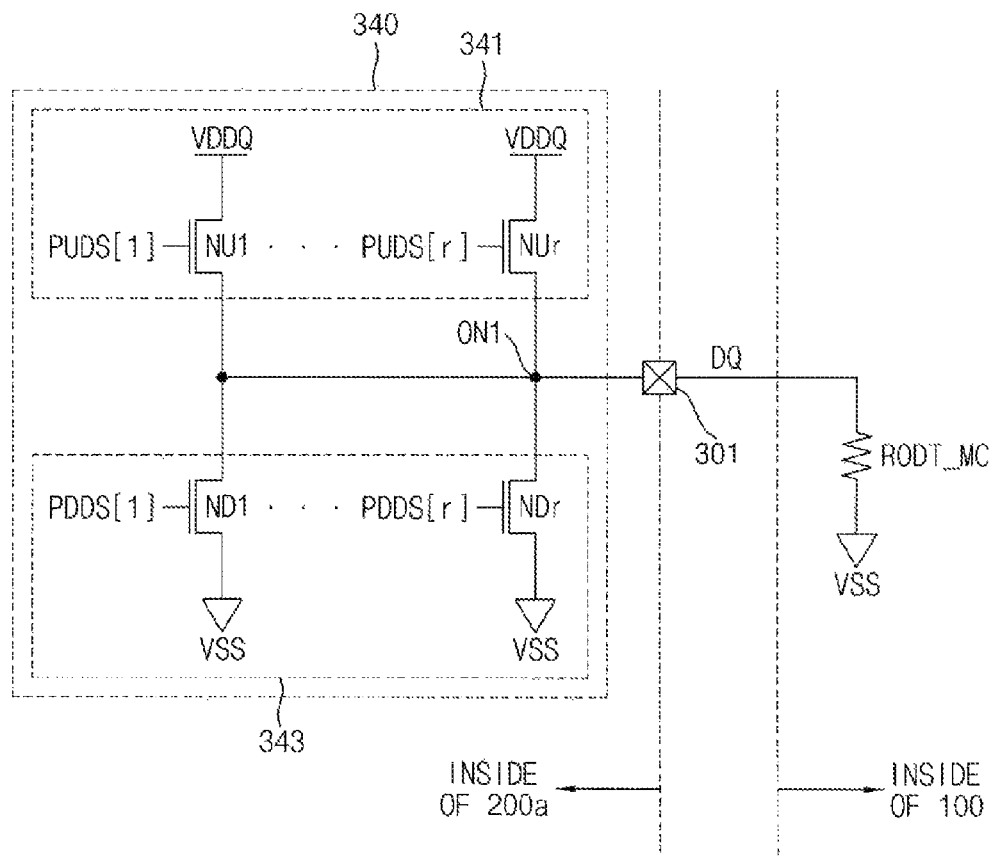
FIG. 6 illustrates circuit diagram of an example of the output driver in the I/O circuit in FIG. 5 according to embodiments of the inventive concept.

FIG. 6 illustrates a circuit diagram of an example of the output driver in the I/O circuit in FIG. 5 according to embodiments of the inventive concept.

Referring to FIG. 6, the output driver 340 may include a pull-up driver 341 and a pull-down driver 343.

The pull-up driver 341 may include first through r-th (r is a natural number greater than 1) pull-up transistors NU1 through NUr connected between the power supply voltage VDDQ and an output node ON1. Each of the first through r-th pull-up transistors NU1 through NUr may be an n-channel metal oxide semiconductor (NMOS) transistor.

The pull-down driver 343 may include first through r-th pull-down transistors ND1 through NDr connected between the output node ON1 and a ground voltage VSS. Each of the first through r-th pull-down transistors ND1 through NDr may be an NMOS transistor.

When the data DTA is at the high level, the pull-up driver 341 may receive the pull-up driving signal PUDS (i.e., PUDS[1] through PUDS[r]) corresponding to the pull-up control code PUCD from the pre-driver 330 and generate the current determined by the pull-up control code PUCD. The transistors ND1 through NDr included in the pull-down driver 343 may all be turned off according to the pull-down driving signal PDDS (i.e., PDDS[1] through PDDS[r]) for turning off the transistors ND1 through NDr.

At this time, when the data DTA is at the high level, the current generated by the pull-up driver 341 may be transmitted to an on-die termination (ODT) resistor RODT_MC in the memory controller 100 via the data I/O (or DQ) pad 301. The data signal DQ that the ODT resistor RODT_MC receives is determined by the current generated by the pull-up driver 341 and the ODT resistor RODT_MC, and has the target output high level voltage VOH that has been adjusted according to the pull-up control code PUCD generated by the impedance calibration circuit 400.

When the data DTA is at the low level, the transistors NU1 through NUr included in the pull-up driver 341 may all be turned off according to the pull-up driving signal PUDS for turning off the transistors NU1 through NUr. The pull-down driver 343 may receive the pull-down driving signal PDDS corresponding to the pull-down control code PDCD from the pre-driver 330 and may have a resistance determined by the pull-down control code PDCD.

At this time, when the data DTA is at the low level, no current is generated by the pull-up driver 341, and therefore, the data signal DQ that ODT resistor RODT_MC receives has an output low level voltage (VOL) voltage which is the same as the ground voltage VSS.

According to embodiments of the inventive concept, the total resistance, e.g., termination resistance (RTT), of the pull-up driver 341 or the pull-down driver 343 may be changed in response to a particular pull-up or pull-down driving signal PUDS or PDDS. At this time, single loading or double loading can be implemented by changing the number of memory modules (when the semiconductor memory devices 200a~200k in FIG. 1 are implemented with one or two memory modules) inserted into a memory slot and an RTT appropriate to conditions can be selected.

For example, the RTT may be changed from RZQ/1 to RZQ/2 and RZQ/4 (where RZQ=240Ω) according to a setting of the mode register 222.

Figure 7:
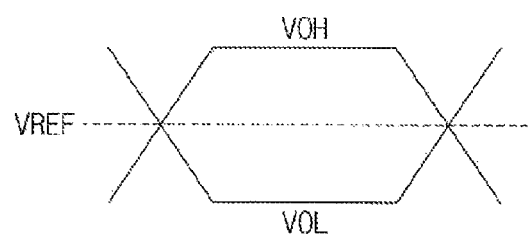
FIG. 7 illustrates a diagram for explaining the operation of the data output circuit in FIG. 6.

FIG. 7 illustrates a diagram for explaining the operation of the data output circuit in FIG. 6.

Referring to FIG. 7, the data signal DQ may have a high level or a low level according to the data DTA. The data signal DQ is an alternating current (AC) signal that swings between VOH and VOL.

The memory controller 100 may receive the data signal DQ from each of the semiconductor memory devices 200a~200k, determine VOH and VOL, and determine a reference voltage VREF from the VOH and VOL. The memory controller 100 may compare the data signal DQ with the reference voltage VREF and determine a received data value (e.g., 0 or 1). Accordingly, by setting the VOH to determine the reference voltage VREF, data reliability can be increased.

Various process-voltage-temperature (PVT) conditions may be applied to each of the semiconductor memory devices 200a~200k. The PVT conditions may include non-uniform doping in a wafer process, a voltage drop as current passes through different elements when power is supplied, and a temperature along a path through which a signal passes. AC on-resistance (hereinafter, referred to as "Ron AC") at the output side of the semiconductor memory devices 200a~200k may vary with the PVT conditions, and the VOH of the data signal DQ may vary with the Ron AC.

Various operating frequencies may be applied to each of the semiconductor memory devices 200a~200k. When the operating frequency is changed, the VOH of the data signal DQ may vary. Therefore, signal integrity of each of the semiconductor memory devices 200a~200k may be enhanced by generating the pull-up control code PUCD and the pull-down control code PDCD according to the PVT conditions (i.e., operating parameters) and the operating frequency, such that the data signal DQ has an optimum VOH.

The memory controller 100 may instruct the semiconductor memory device 200a to change the VOH of the data signal DQ or an impedance of the ODT resistor RODT_MC of the memory controller 100, in the form of a command CMD. The mode register 222 in the control logic circuit 220 may generate a predetermined mode register set signal MRS and the impedance calibration enable signal ZQEN according to the instruction to change the VOH of the data signal DQ or the impedance of the ODT resistor RODT_MC of the memory controller 100.

The impedance calibration circuit 400 may generate pull-up control codes PUCD and pull-down control codes PDCD for different target VOH voltages and store the pull-up control codes PUCD and the pull-down control codes PDCD, in response to the mode register set signal MRS and the impedance calibration enable signal ZQEN during an impedance calibration interval.

When the semiconductor memory device 200a operates with a first frequency during a normal operation interval, the impedance calibration circuit 400 may provide the data output circuit 320 with a first pull-up control code PUCD and a first pull-down control code PDCD for a first target VOH voltage, and the data output circuit 320 may transmit the data signal DQ to the memory controller 100 based on the first pull-up control code PUCD and the first pull-down control code PDCD. When the semiconductor memory device 200a operates with a second frequency different from the first frequency during the normal operation interval, the impedance calibration circuit 400 may provide the data output circuit 320 with a second pull-up control code PUCD and a second pull-down control code PDCD for a second target VOH voltage, and the data output circuit 320 may transmit the data signal DQ to the memory controller 100 based on the second pull-up control code PUCD and the second pull-down control code PDCD.

The mode register set signal MRS may include information about the impedance of the ODT resistor RODT_MC of the memory controller 100 and may include information indicating whether to increase or decrease the VOH of the data signal DQ. The mode register set signal MRS may include frequency information about an operating frequency of the semiconductor memory device 200a.

Figure 8:
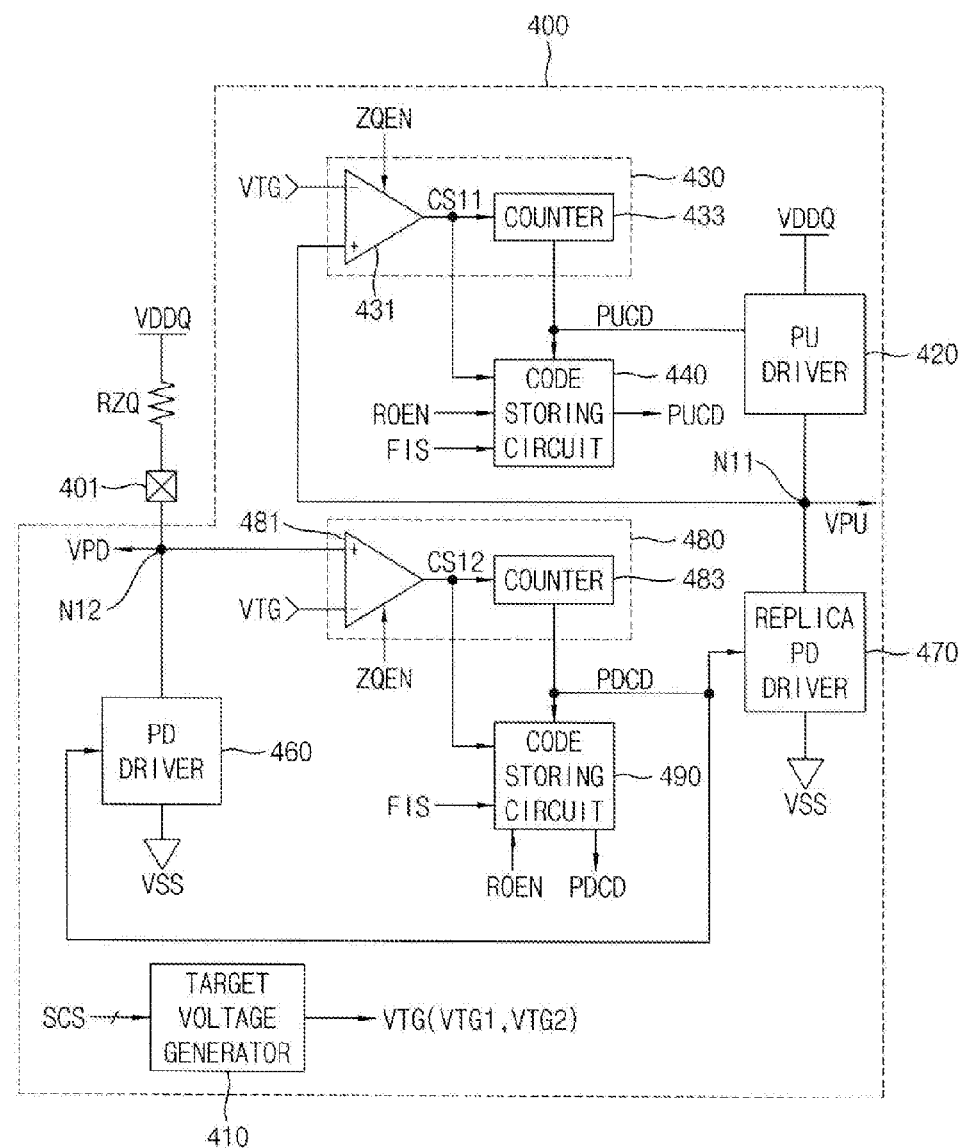
FIG. 8 illustrates a block diagram of an example of the impedance calibration circuit in the semiconductor memory device of FIG. 3 according to embodiments of the inventive concept.

FIG. 8 illustrates a block diagram of an example of the impedance calibration circuit in the semiconductor memory device of FIG. 3 according to embodiments of the inventive concept.

Referring to FIG. 8, the impedance calibration circuit 400 includes a target voltage generator 410, a pull-up (PU) driver 420, a first code generator 430, a first code storing circuit 440, a pull-down (PD) driver 460, a replica pull-down (PD) driver 470, a second code generator 480 and a second code storing circuit 490.

The target voltage generator 410 may generate a target VOH voltage (VTG) in response to a switching control signal SCS. When the switching control signal SCS is varied, the target voltage generator 410 may generate a first target VOH voltage (VTG1) and a second target VOH voltage (VTG2) at different timings in response to the switching control signal SCS. The first target VOH voltage and the second target VOH voltage may have different voltage levels.

The pull-up driver 420 is connected between the power supply voltage VDDQ and a first node N11, and may have a same configuration as the pull-up driver 341 in FIG. 6. The replica pull-down driver 470 is connected between the first node N11 and the ground voltage VSS, and may have a same configuration as the pull-down driver 343 in FIG. 6. The pull-down driver 460 is connected between a second node N12 and the ground voltage VSS, and the second node N12 is coupled to the ZQ pad 401 coupled to the external resistor RZQ. The pull-down driver 460 may have a same configuration as the pull-down driver 343 in FIG. 6.

The first code generator 430 may generate the pull-up control code PUCD obtained from a result of comparing the target VOH voltage VTG with a first voltage (or a pull-up voltage) VPU of the first node N11. The first code generator 430 includes a first comparator 431 and a first counter 433.

The first comparator 431 may be enabled in response to the impedance calibration enable signal ZQEN, may compare the target VOH voltage VTG with the first voltage VPU to output a first comparison signal CS11 and may provide the first comparison signal CS11 to the first counter 433 and the first code storing circuit 440. The first target VOH voltage VTG1 associated with the first operating frequency may be VDDQ/2.5 and the second target VOH voltage VTG2 associated with the second operating frequency may be VDDQ/3.

The first counter 433 may perform a counting operation in response to the first comparison signal CS11 to generate the pull-up control code PUCD and may perform a counting operation to increase or decrease the pull-up control code PUCD until a logic level of the first comparison signal CS11 transits. The first counter 433 may provide the pull-up control code PUCD to the pull-up driver 420 and the first code storing circuit 440.

The pull-up driver 420 may adjust/calibrate a pull-up impedance in response to the pull-up control code PUCD. The pull-up control code PUCD may be calibrated/changed until the target VOH voltage VTG becomes the same as the pull-up voltage VPU.

The first code storing circuit 440 may store the pull-up control code PUCD when the logic level of the first comparison signal CS11 transits. That is, the first code storing circuit 440 may store the pull-up control code PUCD when the target VOH voltage VTG becomes the pull-up voltage VPU. When the target VOH voltage VTG is changed, the first code storing circuit 440 may store at least a plurality of pull-up control codes PUCD. In addition, the first code storing circuit 440 may apply the pull-up control code PUCD corresponding to the frequency information signal FIS to the (output) pull-up driver 341 in FIG. 6 via the pre-driver 330 in FIG. 5, in response to a register output enable signal ROEN and the frequency information signal FIS.

The second code generator 480 may generate the pull-down control code PDCD obtained from a result of comparing the target VOH voltage VTG with a second voltage (or a pull-down voltage) VPD of the second node N12. The second code generator 480 includes a second comparator 481 and a second counter 483.

The second comparator 481 may be enabled in response to the impedance calibration enable signal ZQEN, may compare the target VOH voltage VTG with the second voltage VPD to output a second comparison signal CS12 and may provide the second comparison signal CS12 to the second counter 483 and the second code storing circuit 490.

The second counter 483 may perform a counting operation in response to the second comparison signal CS12 to generate the pull-down control code PDCD and may perform a counting operation to increase or decrease the pull-down control code PDCD until a logic level of the second comparison signal CS12 transits. The second counter 483 may provide the pull-down control code PDCD to the pull-down driver 460, the replica pull-down driver 470 and the second code storing circuit 490.

The pull-down driver 460 may adjust/calibrate a pull-down impedance in response to the pull-down control code PDCD. The replica pull-down driver 470 may adjust/calibrate a pull-down impedance in response to the pull-down control code PDCD. The pull-down control code PDCD may be calibrated/changed until the target VOH voltage VTG becomes the same as the pull-down voltage VPD.

The second code storing circuit 490 may store the pull-down control code PDCD when the logic level of the second comparison signal CS12 transits. That is, the second code storing circuit 490 may store the pull-down control code PDCD when the target VOH voltage VTG becomes the pull-down voltage VPD. When the target VOH voltage VTG is changed, the second code storing circuit 490 may store at least a plurality of pull-down control codes PDCD. In addition, the second code storing circuit 490 may apply the pull-down control code PDCD corresponding to the frequency information signal FIS to the (output) pull-down driver 343 in FIG. 6 via the pre-driver 330 in FIG. 5, in response to the register output enable signal ROEN and the frequency information signal FIS.

In FIG. 8, the switching control signal SCS, the frequency information signal FIS and the register output enable signal ROEN may be included in the mode register set signal MRS.

Figure 9:
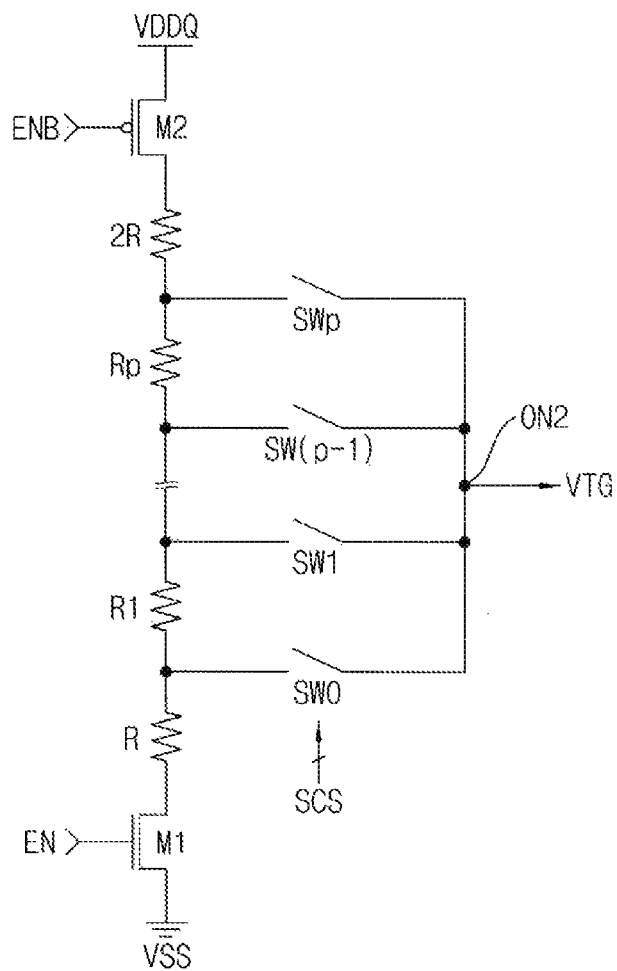
FIG. 9 illustrates a circuit diagram of the target voltage generator in the impedance calibration circuit of FIG. 8 according to embodiments of the inventive concept.

FIG. 9 illustrates a circuit diagram of the target voltage generator in the impedance calibration circuit of FIG. 8 according to exemplary embodiments.

Referring to FIG. 9, the target voltage generator 410 includes enable transistors M1 and M2, a plurality of resistors R, R1~Rp and 2R (where p is a natural number greater than 2) and a plurality of switches SW0, SW1, SW(p−1) and SWp (i.e., SW0~SWp).

The first enable transistor M1 is connected to the ground voltage VSS and has a gate receiving an enable signal EN. The first enable transistor M1 may be an NMOS transistor. The second enable transistor M2 is connected to the power supply voltage VDDQ and has a gate receiving an inverted enable signal ENB. The second enable transistor M2 may be a PMOS transistor.

The plurality of resistors R, R1~Rp and 2R may be connected in series between the first enable transistor M1 and the second enable transistor M2. Each of switches SW0 through SWp have a first end connected between a node between two adjacent resistors among the resistors R, R1~Rp and 2R, and a second end connected to an output node ON2 through which the target VOH voltage (VTG) is output.

The switches SW0 through SW0~SWp may respectively receive the bits of the switching control signal SCS. For example, the switching control signal SCS may include (p+1) bits and the switches SW0~SWp may sequentially and respectively receive the (p+1) bits.

The plurality of resistors R, R1~Rp and 2R may have the same resistance, but in some embodiments the resistors R, R1~Rp and 2R may not have the same resistance. It is assumed that the resistors R1 through Rp have the same resistance as the resistor R in FIG. 9.

When the enable signal EN is at the high level, the target voltage generator 410 may output the target VOH voltage VTG determined by voltage division performed according to the connection state of the switches determined by the switching control signal SCS. For example, when the bits of the switching control signal SCS have first bit values, target voltage generator 410 may output a first target VOH voltage VTG1. For example, when the bits of the switching control signal SCS have second bit values, target voltage generator 410 may output a second target VOH voltage VTG2.

In FIG. 9, the enable signal EN and the inverted enable signal EN may be included in the mode register set signal MRS.

Figure 10A:
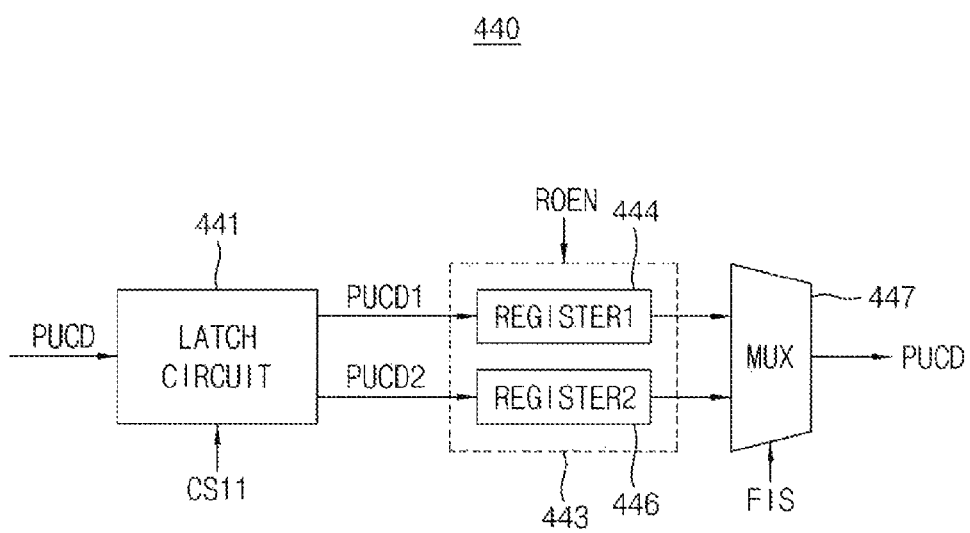
FIG. 10A illustrates the first code storing circuit in the impedance calibration circuit of FIG. 8 according to embodiments of the inventive concept.

FIG. 10A illustrates the first code storing circuit in the impedance calibration circuit of FIG. 8 according to embodiments of the inventive concept.

Referring to FIG. 10A, the first code storing circuit 440 includes a first latch circuit 441, a first register unit 443 and a first multiplexer 447.

The first latch circuit 441 may latch a first pull-up control code PUCD1 for the first target VOH voltage VGT1 and a second pull-up control code PUCD2 for the second target VOH voltage VGT2 at different timings, in response to a transition of the first comparison signal CS11. The first register unit 443 includes a first register (Register1) 444 and a second register (Register2) 446. The first register 444 may store the first pull-up control code PUCD1 and the second register 446 may store the second pull-up control code PUCD2.

The first register 444 and the second register 446 may output the first pull-up control code PUCD1 and the second pull-up control code PUCD2 to the first multiplexer 447 respectively, in response to the register output enable signal ROEN. The first multiplexer 447 may select one of the first pull-up control code PUCD1 and the second pull-up control code PUCD2 in response to the frequency information signal FIS and output the selected one as the pull-up control code PUCD to the (output) pull-up driver 341 in FIG. 6 via the pre-driver 330 in FIG. 5.

Although it is described that the first register unit 443 may include the first register 444 and the second register 446, in other embodiments the first register unit 443 may include three or more registers that store different pull-up control codes respectively.

Figure 10B:
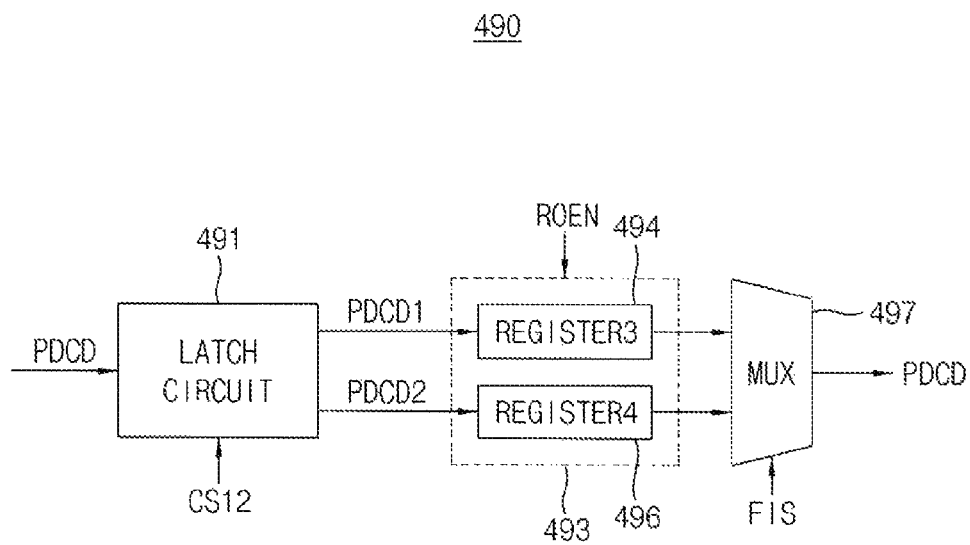
FIG. 10B illustrates the second code storing circuit in the impedance calibration circuit of FIG. 8 according to embodiments of the inventive concept.

FIG. 10B illustrates the second code storing circuit in the impedance calibration circuit of FIG. 8 according to embodiments of the inventive concept.

Referring to FIG. 10B, the second code storing circuit 490 includes a second latch circuit 491, a second register unit 493 and a second multiplexer 497.

The second latch circuit 491 may latch a first pull-down control code PDCD1 for the first target VOH voltage VTG1 and a second pull-down control code PDCD2 for the second target VOH voltage VTG2 at different timings, in response to a transition of the second comparison signal CS12. The second register unit 493 may include a third register (Register3) 494 and a fourth register (Register4) 496. The third register 494 may store the first pull-down control code PDCD1 and the fourth register 496 may store the second pull-down control code PDCD2.

The third register 494 and the fourth register 496 may output the first pull-down control code PDCD1 and the second pull-down control code PDCD2 to the second multiplexer 497 respectively, in response to the register output enable signal ROEN. The second multiplexer 497 may select one of the first pull-down control code PDCD1 and the second pull-down control code PDCD2 in response to the frequency information signal FIS and output the selected one as the pull-down control code PDCD to the (output) pull-down driver 343 in FIG. 6 via the pre-driver 330 in FIG. 5.

Although it is described that the second register unit 493 may include the third register 494 and the fourth register 496, in other embodiments the second register unit 493 may include three or more registers that store different pull-down control codes respectively.

Figure 11:
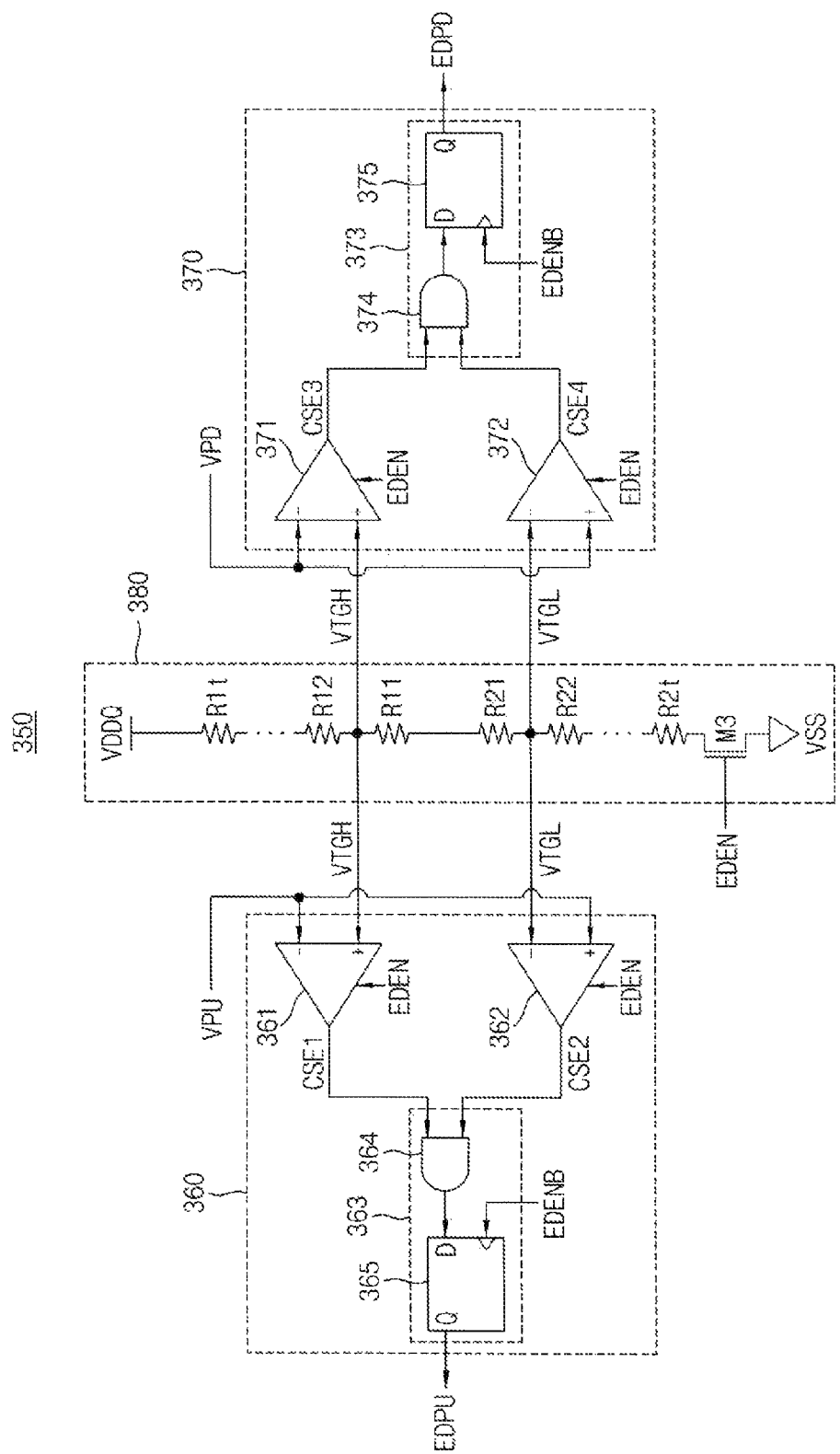
FIG. 11 illustrates a detection circuit that may be included in the semiconductor memory device of FIG. 3 according to embodiments of the inventive concept.

FIG. 11 illustrates a detection circuit that may be included in the semiconductor memory device of FIG. 3 according to embodiments of the inventive concept.

Referring to FIGS. 3 and 11, a detection circuit 350 may be disposed close to the impedance calibration circuit 400 in the semiconductor memory device 200a. The detection circuit 350 includes a first verification unit 360, a second verification unit 370 and a reference voltage generator 380.

The reference voltage generator 380 may generate a first reference voltage VTGH and a second reference voltage VTGL based on the power supply voltage VDDQ, the ground voltage VSS and a verification enable signal EDEN. The reference voltage generator 380 includes a plurality of resistors R1t~R12, R11, R21 and R22~R2t and a transistor M3. The plurality of resistors R1t~R12, R11, R21 and R22~R2t and the transistor M3 may be connected in series between the power supply voltage VDDQ and the ground voltage VSS. The transistor M3 may be selectively turned on based on the verification enable signal EDEN. The verification enable signal EDEN may be generated and provided by the control logic circuit 220 shown in FIG. 3.

In some embodiments, each of the first reference voltage VTGH and the second reference voltage VTGL may have a value corresponding to an accuracy of the impedance calibration verifying operation. For example, if the accuracy of the impedance calibration verifying operation is set to ±5%, a level of the first reference voltage VTGH may be higher than a level of the target VOH voltage VTG by 5%, and a level of the second reference voltage VTGL may be lower than the level of the target VOH voltage VTG by 5%. The levels of the first and second reference voltages VTGH and VTGL may be determined based on the number of the resistors R1t~R12, R11, R21 and R22~R2t and resistances of the resistors R1t~R12, R11, R21 and R22~R2t.

The first verification unit 360 may perform the first verifying operation for the pull-up impedance calibration operation based on the pull-up voltage VPU. For example, the first verification unit 360 may generate a first detection signal EDPU based on the first reference voltage VTGH, the second reference voltage VTGL, the pull-up voltage VPU and the verification enable signal EDEN. The first verification unit 360 includes a first comparator 361, a second comparator 362 and a first detection signal generation unit 363.

The first comparator 361 may generate a first comparison signal CSE1 by comparing the pull-up voltage VPU with the first reference voltage VTGH based on the verification enable signal EDEN. The second comparator 362 may generate a second comparison signal CSE2 by comparing the pull-up voltage VPU with the second reference voltage VTGL based on the verification enable signal EDEN.

The first detection signal generation unit 363 may generate the first detection signal EDPU based on the verification enable signal EDEN and the first and second comparison signals CSE1 and CSE2. The first detection signal generation unit 363 includes a first AND gate 364 and a first flip-flop 365. The first AND gate 364 may perform an AND operation on the first comparison signal CSE1 and the second comparison signal CSE2. The first flip-flop 365 may generate the first detection signal EDPU based on an output of the first AND gate 364 and an inversion signal EDENB of the verification enable signal EDEN.

The second verification unit 370 may perform the second verifying operation for the pull-down impedance calibration operation based on the pull-down voltage VPD. For example, the second verification unit 370 may generate a second detection signal EDPD based on the first reference voltage VTGH, the second reference voltage VTGL, the pull-down voltage VPD and the verification enable signal EDEN. The second verification unit 370 includes a third comparator 371, a fourth comparator 372 and a second detection signal generation unit 373.

The third comparator 371 may generate a third comparison signal CSE3 by comparing the pull-down voltage VPD with the first reference voltage VTGH based on the verification enable signal EDEN. The fourth comparator 372 may generate a fourth comparison signal CSE4 by comparing the pull-down voltage VPD with the second reference voltage VTGL based on the verification enable signal EDEN.

The second detection signal generation unit 373 may generate the second detection signal EDPD based on the verification enable signal EDEN and the third and fourth comparison signals CSE3 and CSE4. The second detection signal generation unit 373 includes a second AND gate 374 and a second flip-flop 375. The second AND gate 374 may perform the AND operation on the third comparison signal CSE3 and the fourth comparison signal CSE4. The second flip-flop 375 may generate the second detection signal EDPD based on an output of the second AND gate 374 and the inversion signal EDENB of the verification enable signal EDEN.

Figure 12:
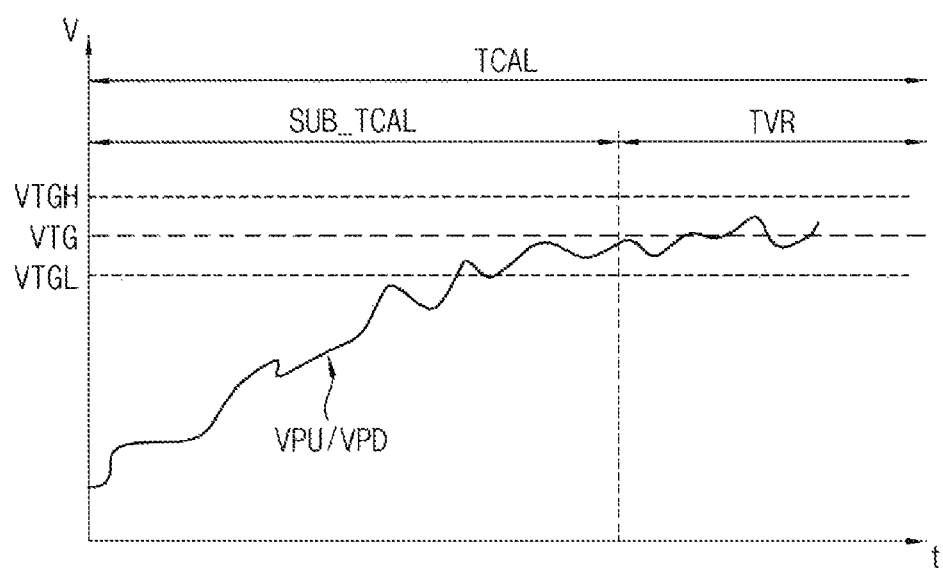
FIG. 12 illustrates a diagram for describing operations of the impedance calibration circuit of FIG. 8 and the detection circuit of FIG. 11.

FIG. 12 illustrates a diagram for describing operations of the impedance calibration circuit of FIG. 8 and the detection circuit of FIG. 11. In FIG. 12, the horizontal axis represents time t and the vertical axis represents voltage V. The curve indicated as VPU/VPD is intended to represent either the pull-up voltage or the pull-down voltage generated by the impedance calibration circuit 400 shown in FIG. 8.

Referring to FIGS. 8, 11 and 12, the impedance calibration circuit 400 may perform the impedance calibration operation during an impedance calibration interval TCAL. For example, when the impedance calibration enable signal ZQEN is activated based on the command CMD, the impedance calibration interval TCAL may begin, and the pull-up impedance calibration operation and the pull-down impedance calibration operation may be performed during the impedance calibration interval TCAL. If the pull-up impedance calibration operation and the pull-down impedance calibration operation are normally completed, each of the pull-up voltage VPU and the pull-down voltage VPD may have a level that is adjacent to the target VOH voltage VTG.

The detection circuit 350 may perform the impedance calibration verifying operation during a verifying interval TVR. For example, when the verification enable signal EDEN is activated after the impedance calibration enable signal ZQEN is activated, the verifying interval TVR may begin, and the first verifying operation and the second verifying operation may be performed during the verifying interval TVR. As illustrated in FIG. 12, if both the level of the pull-up voltage VPU and the level of the pull-down voltage VPD are between the level of the first reference voltage VTGH and the level of the second reference voltage VTGL, the detection circuit 350 may determine that both the pull-up impedance calibration operation and the pull-down impedance calibration operation are normally performed.

Although not illustrated in FIG. 12, if at least one selected from the level of the pull-up voltage VPU and the level of the pull-down voltage VPD is respectively higher than the level of the first reference voltage VTGH or is lower than the level of the second reference voltage VTGL, the detection circuit 350 may determine that at least one selected from the pull-up impedance calibration operation and the pull-down impedance calibration operation is abnormally performed.

The first detection signal EDPU and the second detection signal EDPD may be transmitted to the host 20 in FIG. 1 through the memory controller 100. A user may determine whether the impedance calibration operation is normally performed based on the first detection signal EDPU and the second detection signal EDPD. When the impedance calibration operation is normally performed, the user controls the memory controller 100 such that the semiconductor memory device 200a performs the above-mentioned impedance calibration operation during an idle interval of the memory system 30.

Figure 13:
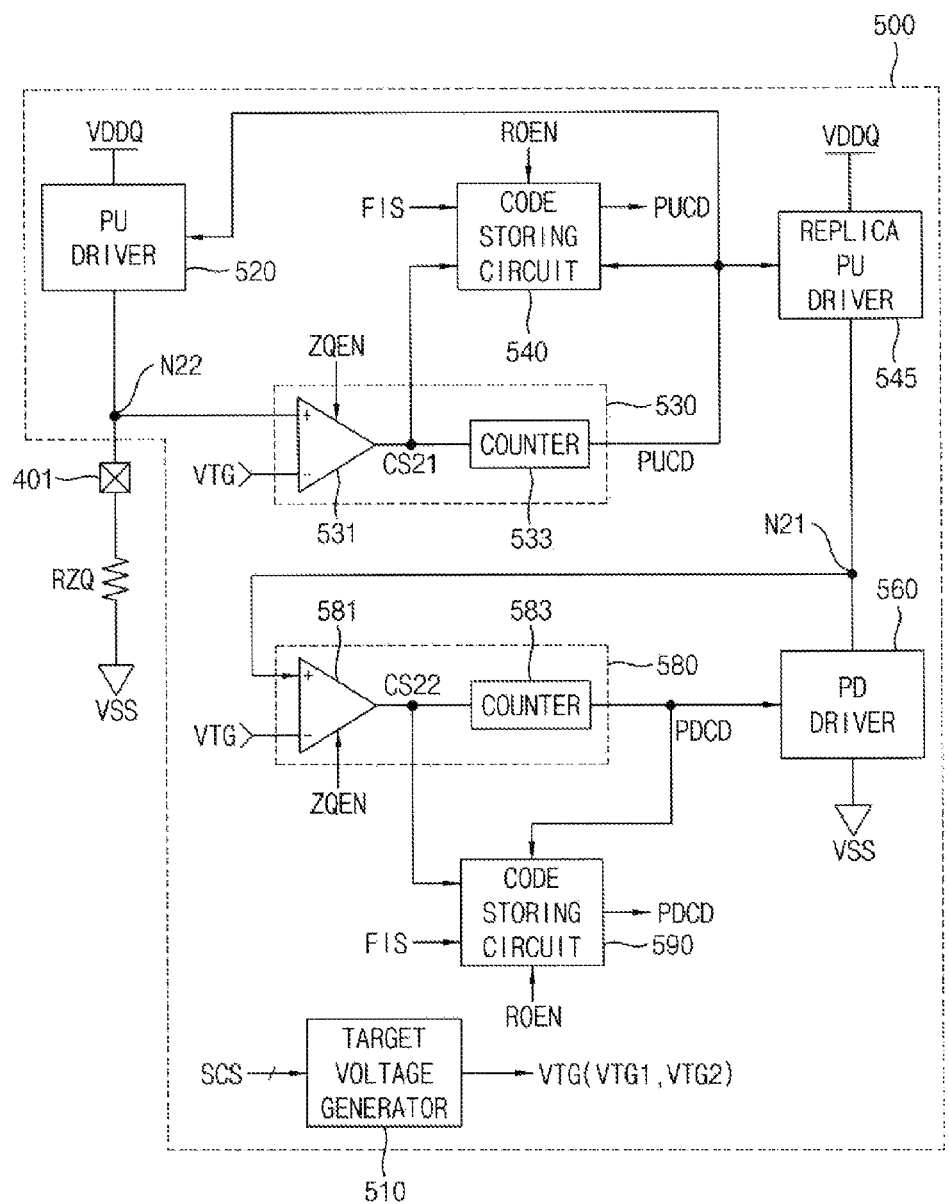
FIG. 13 illustrates a block diagram of another example of the impedance calibration circuit in the semiconductor memory device of FIG. 3 according to embodiments of the inventive concept.

FIG. 13 illustrates a block diagram of another example of the impedance calibration circuit in the semiconductor memory device of FIG. 3 according to embodiments of the inventive concept.

Referring to FIG. 13, an impedance calibration circuit 500 includes a target voltage generator 510, a pull-up driver 520, a first code generator 530, a first code storing circuit 540, a replica pull-up driver 545, a pull-down driver 560, a second code generator 580 and a second code storing circuit 590.

The impedance calibration circuit 500 in FIG. 13 differs from the impedance calibration circuit 400 of FIG. 8 in that in the impedance calibration circuit 500 the external resistor RZQ coupled to the ZQ pad 401 is connected to the ground voltage VSS and the impedance calibration circuit 500 includes the replica pull-up driver 545 instead of the replica pull-down driver 470.

Hereinafter, the following description will focus on the differences between the impedance calibration circuit 500 in FIG. 13 and the impedance calibration circuit 400 in FIG. 8, whereby description of circuit elements in the impedance calibration circuit 500 corresponding to circuit elements in the impedance calibration circuit 400 may be omitted for brevity.

The target voltage generator 510 may generate the target VOH voltage VTG (VTG1, VTG2) in response to the switching control signal SCS.

The replica pull-up driver 545 and the pull-down driver 560 are connected at a first node N21, the replica pull-up driver 545 is connected between the power supply voltage VDDQ and the first node N21, and the pull-down driver 560 is connected between the first node N21 and the ground voltage VSS.

The first code generator 530 may generate the pull-up control code PUCD obtained from a result of comparing the target VOH voltage VTG with a voltage of the second node N22. The first code generator 530 includes a first comparator 531 and a first counter 533. The first comparator 531 may be enabled in response to the impedance calibration enable signal ZQEN, may compare the target VOH voltage VTG with the voltage of the second node N22 to output a first comparison signal CS21 and may provide the first comparison signal CS21 to the first counter 533 and the first code storing circuit 540.

The first counter 533 may perform a counting operation in response to the first comparison signal CS21 to generate the pull-up control code PUCD and may perform a counting operation to increase or decrease the pull-up control code PUCD until a logic level of the first comparison signal CS21 transits. The pull-up control code PUCD may be calibrated/changed until the target VOH voltage VTG becomes the same as the voltage of the second node N22. The first code storing circuit 540 may store the pull-up control code PUCD when the target VOH voltage VTG becomes the voltage of the second node N22.

The second code generator 580 may generate the pull-down control code PDCD obtained from a result of comparing the target VOH voltage VTG with a voltage of the first node N21. The second code generator 580 includes a second comparator 581 and a second counter 583. The second comparator 581 may be enabled in response to the impedance calibration enable signal ZQEN, may compare the target VOH voltage VTG with the voltage of the first node N21 to output a second comparison signal CS22 and may provide the second comparison signal CS22 to the second counter 583 and the second code storing circuit 590.

The second counter 583 may perform a counting operation in response to the second comparison signal CS22 to generate the pull-down control code PDCD and may perform a counting operation to increase or decrease the pull-down control code PDCD until a logic level of the second comparison signal CS22 transits. The pull-down control code PDCD may be calibrated/changed until the target VOH voltage VTG becomes the same as the voltage of the first node N21. The second code storing circuit 590 may store the pull-down control code PDCD when the target VOH voltage VTG becomes the voltage of the first node N21.

Operation of the impedance calibration circuit 500 may be substantially the same as the impedance calibration circuit 400, and thus detailed description on the operation of the impedance calibration circuit 500 will be omitted.

Figure 14:
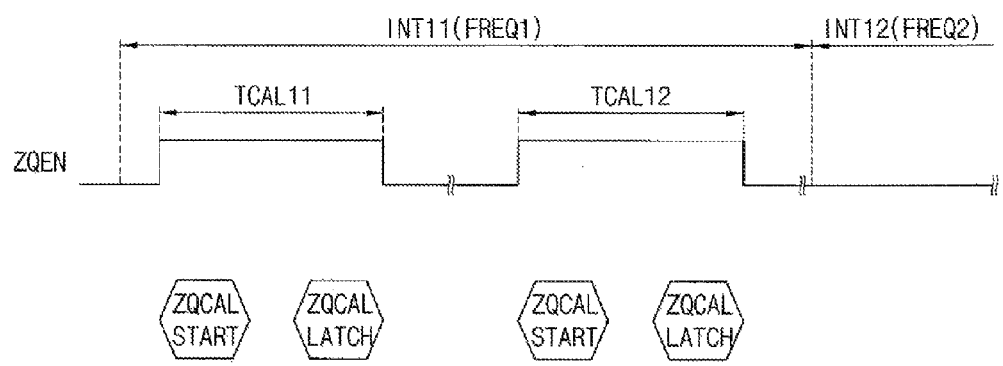
FIG. 14 illustrates a diagram explanatory of an operation of the impedance calibration circuit of FIG. 8 or FIG. 13.

FIG. 14 illustrates a diagram explanatory of an operation of the impedance calibration circuit of FIG. 8 or FIG. 13.

Referring to FIGS. 3 through 10, 13 and 14, during a first interval INT11 in which the semiconductor memory device 200*a* operates with a first frequency FREQ1, the mode register 222 activates impedance calibration enable signal ZQEN in response to a first command CMD from the memory controller 100.

With respect to the impedance calibration circuit 400 of FIG. 8, during a first impedance calibration interval TCAL11 in which the impedance calibration enable signal ZQEN is activated, the impedance calibration circuit 400 performs an impedance calibration operation for the first target VOH voltage VTG1. For example, when the impedance calibration enable signal ZQEN is activated, the impedance calibration operation for the first target VOH voltage VTG1 begins (at ZQCAL START of TCAL11), the pull-up control code PUCD is latched by first code storing circuit 440 at a timing when the first target VOH voltage VTG1 becomes the same as the voltage of the first node N11, the pull-down control code PDCD is latched by second code storing circuit 490 at a timing when the first target VOH voltage VTG1 becomes the same as the voltage of the second node N12, and the latched pull-up control code PUCD and the latched pull-down control code PDCD are respectively stored in the first code storing circuit 440 and the second code storing circuit 490.

During the first interval INT11 in which the semiconductor memory device 200*a* operates with the first frequency FREQ1, the mode register 222 activates impedance calibration enable signal ZQEN again in response to a second command CMD from the memory controller 100.

During a second impedance calibration interval TCAL12 in which the impedance calibration enable signal ZQEN is activated, the impedance calibration circuit 400 of FIG. 8 performs an impedance calibration operation for the second target VOH voltage VTG2. For example, when the impedance calibration enable signal ZQEN is activated, the impedance calibration operation for the second target VOH voltage VTG2 begins (at ZQCAL START of TCAL12), the pull-up control code PUCD is latched by first code storing circuit 440 at a timing when the second target VOH voltage VTG2 becomes the same as the voltage of the first node N11, the pull-down control code PDCD is latched by second code storing circuit 490 at a timing when the second target VOH voltage VTG2 becomes the same as the voltage of second node N12, and the latched pull-up control code PUCD and the latched pull-down control code PDCD are respectively stored in the first code storing circuit 440 and the second code storing circuit 490.

With respect to the impedance calibration circuit 500 of FIG. 13, during a first impedance calibration interval TCAL11 in which the impedance calibration enable signal ZQEN is activated, the impedance calibration circuit 500 performs an impedance revised paragraphs calibration operation for the first target VOH voltage VTG1. For example, when the impedance calibration enable signal ZQEN is activated, the impedance calibration operation for the first target VOH voltage VTG1 begins (at ZQCAL START of TCAL11), the pull-up control code PUCD is latched by first code storing circuit 540 at a timing when the first target VOH voltage VTG1 becomes the same as the voltage of the second node N22, the pull-down control code PDCD is latched by second code storing circuit 590 at a timing when the first target VOH voltage VTG1 becomes the same as the voltage of the first node N21, and the latched pull-up control code PUCD and the latched pull-down control code PDCD are respectively stored in the first code storing circuit 540 and the second code storing circuit 590.

During the first interval INT11 in which the semiconductor memory device 200*a* operates with the first frequency FREQ1, the mode register 222 activates impedance calibration enable signal ZQEN again in response to a second command CMD from the memory controller 100.

During a second impedance calibration interval TCAL12 in which the impedance calibration enable signal ZQEN is activated, the impedance calibration circuit 500 of FIG. 13 performs an impedance calibration operation for the second target VOH voltage VTG2. For example, when the impedance calibration enable signal ZQEN is activated, the impedance calibration operation for the second target VOH voltage VTG2 begins (at ZQCAL START of TCAL12), the pull-up control code PUCD is latched by first code storing circuit 540 at a timing when the second target VOH voltage VTG2 becomes the same as the voltage of the second node N22, the pull-down control code PDCD is latched by second code storing circuit 590 at a timing when the second target VOH voltage VTG2 becomes the same as the voltage of first node N21, and the latched pull-up control code PUCD and the latched pull-down control code PDCD are respectively stored in the first code storing circuit 540 and the second code storing circuit 590.

The data output circuit 320 transmits the data signal DQ to the memory controller 100 based on the pull-up control code PUCD and the pull-down control code PDCD for the first target VOH voltage VTG1 between the first impedance calibration interval TCAL11 and the second impedance calibration interval TCAL12 of the first interval INT11, or after the second impedance calibration interval TCAL12. In addition, the data output circuit 320 transmits the data signal DQ to the memory controller 100 based on the pull-up control code PUCD and the pull-down control code PDCD for the second target VOH voltage VTG2 during the second interval INT12 in which the semiconductor memory device 200a operates with a second voltage FREQ2.

As may be understood with respect to FIG. 14, the impedance calibration circuit 400 of FIG. 8 or the impedance calibration circuit 500 of FIG. 13 may sequentially generate and store the pull-up control codes PUCD and the pull-down control codes PDCD for different target VOH voltages VTG in response to the first command and the second command which are applied from the memory controller 100 at different timings.

Figure 15:
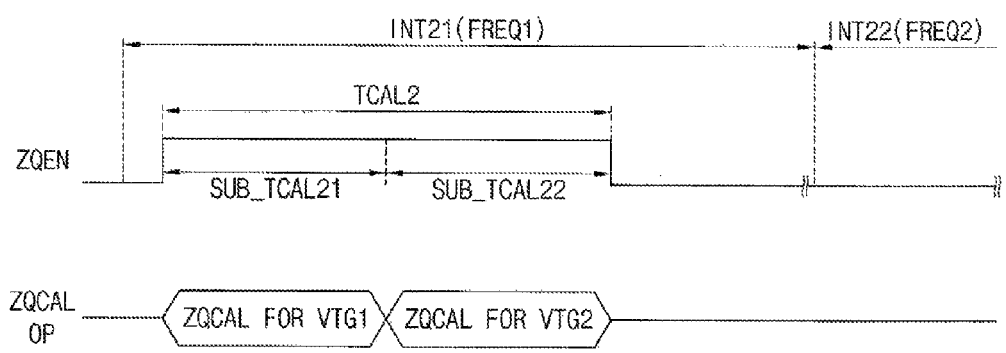
FIG. 15 illustrates a diagram explanatory of an operation of the impedance calibration circuit of FIG. 8 or FIG. 13.

FIG. 15 illustrates a diagram for describing an operation of the impedance calibration circuit of FIG. 8 or FIG. 13.

Referring to FIGS. 3 through 10, 13 and 15, during a first interval INT21 in which the semiconductor memory device 200a operates with a first frequency FREQ1, the mode register 222 activates impedance calibration enable signal ZQEN in response to a first command CMD from the memory controller 100.

During a first sub calibration interval SUB_TCAL21 of an impedance calibration interval TCAL2 in which the impedance calibration enable signal ZQEN is activated, the impedance calibration circuit 400 of FIG. 8 or the impedance calibration circuit 500 of FIG. 13 performs an impedance calibration operation for the first target VOH voltage VTG1 and respectively stores the pull-up control code PUCD in the first code storing circuits 440 and 540, and respectively stores the pull-down control code PDCD in the second code storing circuits 490 or 590 (at ZQCAL FOR VTG1). During a second sub calibration interval SUB_TCAL22 successive to the first sub calibration interval SUB_TCAL21 of the impedance calibration interval TCAL2, the impedance calibration circuit 400 of FIG. 8 or the impedance calibration circuit 500 of FIG. 13 performs an impedance calibration operation for the second target VOH voltage VTG2 and respectively stores the pull-up control code PUCD in the first code storing circuits 440 and 540, and respectively stores the pull-down control code PDCD in the second code storing circuits 490 and 590 (at ZQCAL FOR VTG2).

The data output circuit 320 transmits the data signal DQ to the memory controller 100 based on the pull-up control code PUCD and the pull-down control code PDCD for the first target VOH voltage VTG1 after the impedance calibration interval TCAL2 in the first interval INT21. In addition, the data output circuit 320 transmits the data signal DQ to the memory controller 100 based on the pull-up control code PUCD and the pull-down control code PDCD for the second target VOH voltage VTG2 during the second interval INT22 in which the semiconductor memory device 200a operates with a second voltage FREQ2.

As described with respect to FIG. 15, the impedance calibration circuit 400 of FIG. 8 or the impedance calibration circuit 500 of FIG. 13 may sequentially generate and store the pull-up control codes PUCD and the pull-down control codes PDCD for different target VOH voltages VTG in response to the first command and the second command which are applied from the memory controller 100 at different timings.

Figure 16:
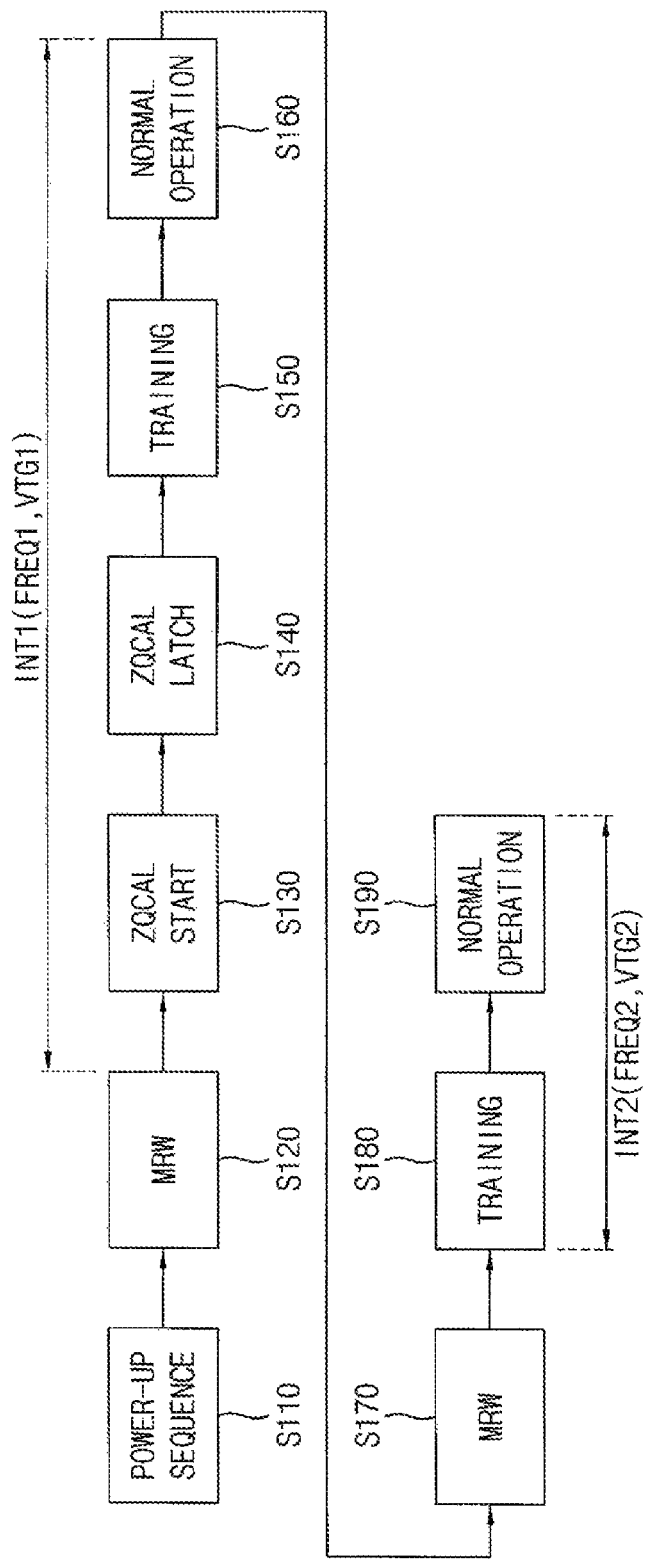
FIG. 16 illustrates a flow chart of an operation of the semiconductor memory device of FIG. 3 according to embodiments of the inventive concept.

FIG. 16 illustrates a flow chart of an operation of the semiconductor memory device of FIG. 3 according to embodiments of the inventive concept.

Referring to FIGS. 2 through 16, when power is applied to the semiconductor memory device 200a, the semiconductor memory device 200a performs a power-up sequence (S110) and increases a level of an operating voltage to a certain level. When the power-up sequence is completed, the memory controller 100 performs a mode register write (MRW) operation on the mode register 222 (S120) and sets the operation mode and operation conditions of the semiconductor memory device 200a. The memory controller 100 writes a write latency and a read latency of the semiconductor memory device 200a in the mode register 222 to set the operation frequency of the semiconductor memory device 200a with the first frequency FREQ1.

When setting the operation mode and operation conditions of the semiconductor memory device 200a are completed, the control logic circuit 220 activates the impedance calibration enable signal ZQEN such that the impedance calibration circuit 400 performs an impedance calibration operation (S130 and S140). The impedance calibration circuit 400 starts the impedance calibration operation in response to the activation of the impedance calibration enable signal ZQEN (S130), and stores the pull-up control code PUCD and the pull-down control code PDCD by performing the impedance calibration operation for at least one target VOH voltage VTG (S140). At this time, the pull-up control code PUCD and the pull-down control code PDCD pairs for the first target VOH voltage VTG1 and the second target VOH voltage VTG2 may be sequentially stored.

When the impedance calibration operation is completed, the memory controller 100 and the semiconductor memory device 200a start training operations including command/bus training and data signal training (S150). When the training operation is completed, the semiconductor memory device 200a performs normal memory operations including write operations and read operations while the semiconductor memory device 200a operates with the first frequency FREQ1 (S160). At this time, the target VOH voltage VTG corresponds to the first target VOH voltage VTG1.

While the normal memory operation is performed or after the normal memory operation is completed and the operating frequency of the semiconductor memory device 200a needs to be changed, the memory controller 100 resets the operation mode and operation conditions of the semiconductor memory device 200a by performing a mode register write operation on the mode register 222 (S170). At this time, the memory controller 100 writes a write latency and a read latency of the semiconductor memory device 200a in the mode register 222 to set the operation frequency of the semiconductor memory device 200a with a second frequency FREQ2.

When resetting the operation mode and operation conditions of the semiconductor memory device 200a are completed, the memory controller 100 and the semiconductor memory device 200a start training operations including command/bus training and data signal training (S180). When the training operations are completed, the semiconductor memory device 200a performs normal memory operations including write operations and read operations while the semiconductor memory device 200a operates with the second frequency FREQ2 (S190). At this time, the target VOH voltage VTG corresponds to the second target VOH voltage VTG2.

Figure 17:
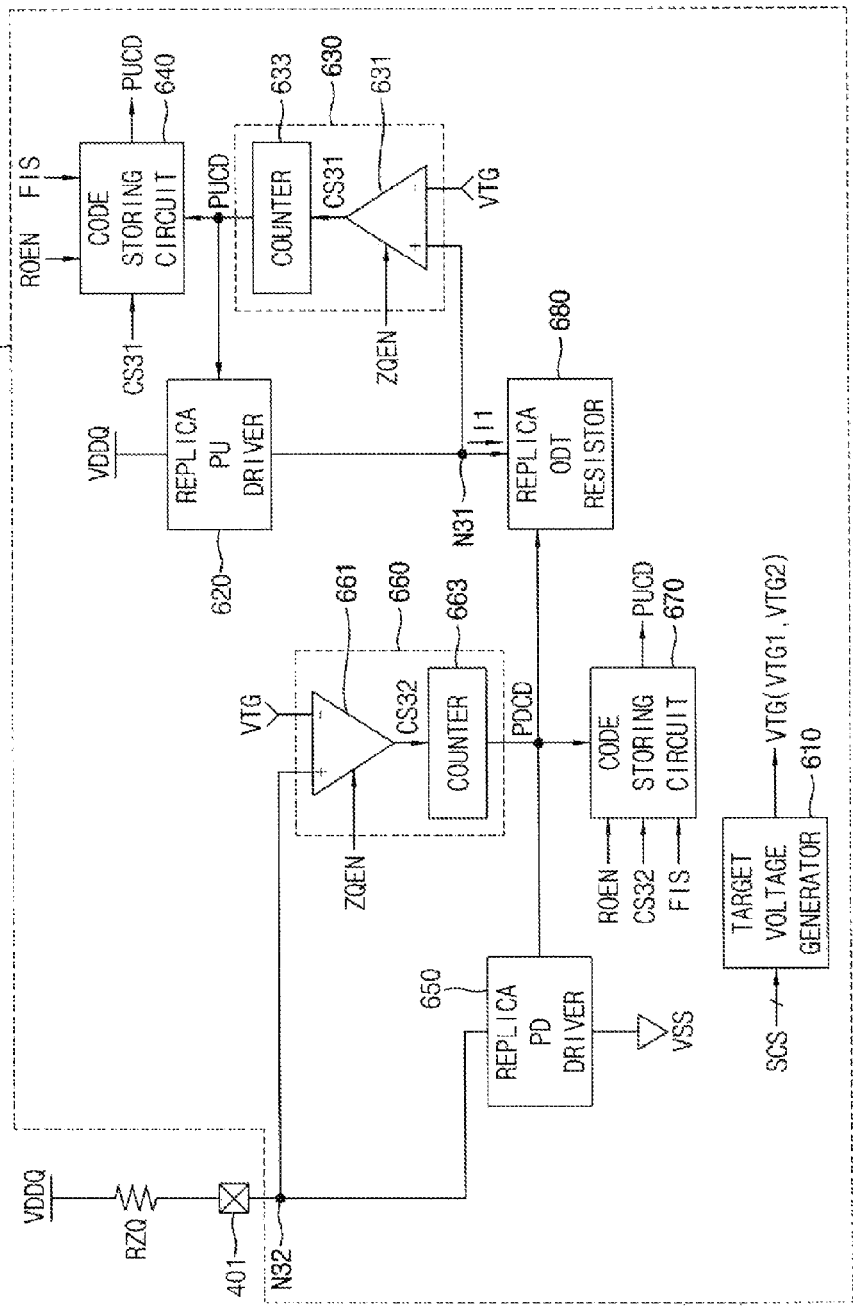
FIG. 17 illustrates a block diagram of another example of the impedance calibration circuit in the semiconductor memory device of FIG. 3 according to embodiments of the inventive concept.

FIG. 17 illustrates a block diagram of another example of the impedance calibration circuit in the semiconductor memory device of FIG. 3 according to embodiments of the inventive concept.

Referring to FIG. 17, an impedance calibration circuit 600 includes a target voltage generator 610, a replica pull-up driver 620, a first code generator 630, a first code storing circuit 640, a replica pull-down driver 650, a second code generator 660, a second code storing circuit 670 and a replica ODT resistor 680.

The impedance calibration circuit 600 differs from the impedance calibration circuit 400 of FIG. 8 in that the replica pull-up driver 620 of the impedance calibration circuit 600 replaces the pull-up driver 420 of the impedance calibration circuit 400, the replica pull-down driver 650 of the impedance calibration circuit 600 replaces the pull-down driver 460 of the impedance calibration circuit 400, and the replica ODT resistor 680 of the impedance calibration circuit 600 replaces the replica pull-down driver 470 of the impedance calibration circuit 400.

Hereinafter, the following description will focus on the differences between the impedance calibration circuit 600 in FIG. 17 and the impedance calibration circuit 400 in FIG. 8, whereby description of circuit elements in the impedance calibration circuit 600 corresponding to circuit elements in the impedance calibration circuit 400 may be omitted for brevity.

The target voltage generator 610 may generate the target VOH voltage VTG (VTG1, VTG2) in response to the switching control signal SCS.

The replica pull-up driver 620 and the replica ODT resistor 680 are connected at a first node N31, the replica ODT resistor 680 may correspond to the ODT resistor RODT_MC in FIG. 6. The replica pull-down driver 650 is connected between a second node N32 and the ground voltage VSS. The second node N32 is coupled to the ZQ pad 401 coupled to the external resistor RZQ. The replica pull-up driver 620 may have a same configuration as the pull-up driver 341 in FIG. 6, and the replica pull-down driver 650 may have a same configuration as the pull-down driver 343 in FIG. 6.

The first code generator 630 may generate the pull-up control code PUCD obtained from a result of comparing the target VOH voltage VTG with a voltage of the first node N31. The first code generator 630 includes a first comparator 631 and a first counter 633. The first comparator 631 may be enabled in response to the impedance calibration enable signal ZQEN, may compare the target VOH voltage VTG with the voltage of the first node N31 to output a first comparison signal CS31 and may provide the first comparison signal CS31 to the first counter 633 and the first code storing circuit 640.

The first counter 633 may perform a counting operation in response to the first comparison signal CS31 to generate the pull-up control code PUCD and may perform a counting operation to increase or decrease the pull-up control code PUCD until a logic level of the first comparison signal CS31 transits. The pull-up control code PUCD may be calibrated/changed until the target VOH voltage VTG becomes the same as the voltage of the first node N31. The first code storing circuit 640 may store the pull-up control code PUCD when the target VOH voltage VTG becomes the voltage of the first node N31.

The second code generator 660 may generate the pull-down control code PDCD obtained from a result of comparing the target VOH voltage VTG with a voltage of the second node N32. The second code generator 660 includes a second comparator 661 and a second counter 663. The second comparator 661 may be enabled in response to the impedance calibration enable signal ZQEN, may compare the target VOH voltage VTG with the voltage of the second node N32 to output a second comparison signal CS32 and may provide the second comparison signal CS32 to the second counter 663 and the second code storing circuit 670.

The second counter 663 may perform a counting operation in response to the second comparison signal CS32 to generate the pull-down control code PDCD and may perform a counting operation to increase or decrease the pull-down control code PDCD until a logic level of the second comparison signal CS32 transits. The pull-down control code PDCD may be calibrated/changed until the target VOH voltage VTG becomes the same as the voltage of the second node N32. The second code storing circuit 670 may store the pull-down control code PDCD when the target VOH voltage VTG becomes the voltage of the second node N32.

The replica pull-up driver 620 may generate a first current I1 flowing across the first node N31 according to the pull-up control code PUCD. The first node N31 may correspond to the output node ON1 and the DQ pad 301 in FIG. 6. The first current I1 may determine the voltage of the first node N31 together with a resistance of the replica ODT resistor 680.

The replica ODT resistor 680 may determine the voltage of the first node N31 based on the first current I1. The replica ODT resistor 680 may be implemented in the same manner as the ODT resistor RODT_MC in FIG. 6. The resistance of the replica ODT resistor 680 may be determined by the pull-down control code PDCD.

Operation of the impedance calibration circuit 600 of FIG. 17 may be substantially the same as the impedance calibration circuit 400 of FIG. 8, and thus detailed description on the operation of the impedance calibration circuit 600 will be omitted.

Figure 18:
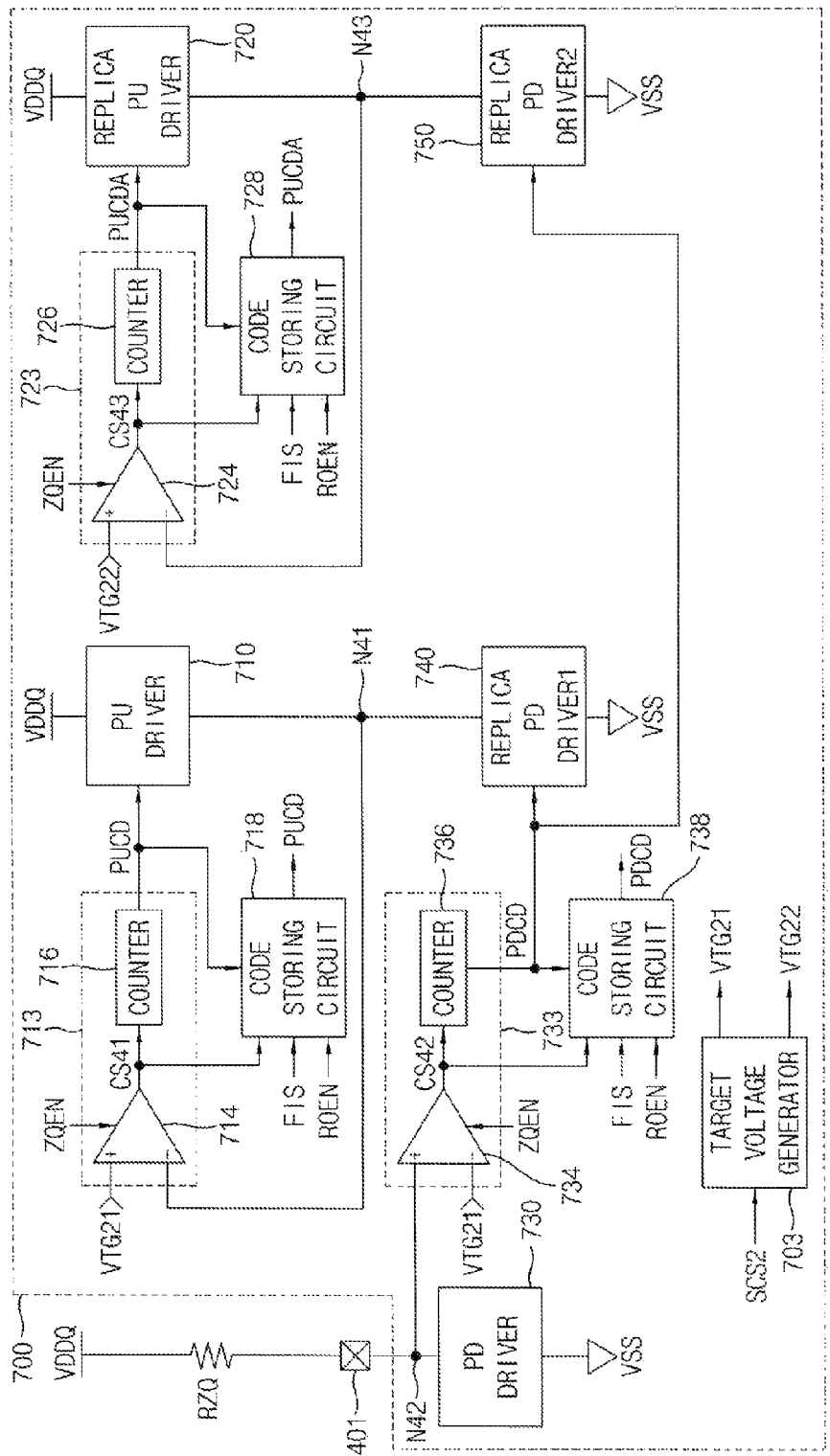
FIG. 18 illustrates a block diagram of another example of the impedance calibration circuit in the semiconductor memory device of FIG. 3 according to embodiments of the inventive concept.

FIG. 18 illustrates a block diagram of another example of the impedance calibration circuit in the semiconductor memory device of FIG. 3 according to embodiments of the inventive concept.

Referring to FIG. 18, an impedance calibration circuit 700 includes a target voltage generator 703, a pull-up driver 710, a first code generator 713, a first code storing circuit 718, a pull-down driver 730, a first replica pull-down driver 740, a second code generator 733, a second code storing circuit 738, a replica pull-up driver 720, a third code generator 723, a third code storing circuit 728 and a second replica pull-down driver 750.

The impedance calibration circuit 700 of FIG. 18 differs from the impedance calibration circuit 400 of FIG. 8 in that the impedance calibration circuit 700 of FIG. 18 further includes the replica pull-up driver 720, the third code generator 723, the third code storing circuit 728 and the second replica pull-down driver 750.

Hereinafter, the following description will focus on the differences between the impedance calibration circuit 700 in FIG. 18 and the impedance calibration circuit 400 in FIG. 8, whereby description of circuit elements in the impedance calibration circuit 700 corresponding to circuit elements in the impedance calibration circuit 400 may be omitted for brevity.

The target voltage generator 710 may generate the target VOH voltage in response to the switching control signal SCS.

The replica pull-up driver 720 is connected between the power supply voltage VDDQ and a first node N43, and the second replica pull-down driver 750 is connected between the third node N43 and the ground voltage VSS.

The first code generator 713 may generate the pull-up control code PUCD obtained from a result of comparing a first target VOH voltage VTG21 with a voltage of a first node N41. The first code generator 713 includes a first comparator 714 and a first counter 716. The first comparator 713 may be enabled in response to the impedance calibration enable signal ZQEN, may compare the first target VOH voltage VTG21 with the voltage of the first node N41 to output a first comparison signal CS41 and may provide the first comparison signal CS41 to the first counter 716 and the first code storing circuit 718.

The first counter 716 may perform a counting operation in response to the first comparison signal CS41 to generate the pull-up control code PUCD and may perform a counting operation to increase or decrease the pull-up control code PUCD until a logic level of the first comparison signal CS41 transits. The pull-up control code PUCD may be calibrated/changed until the first target VOH voltage VTG21 becomes the same as the voltage of the first node N41. The first code storing circuit 718 may store the pull-up control code PUCD when the first target VOH voltage VTG21 becomes the voltage of the first node N41.

The second code generator 733 may generate the pull-down control code PDCD obtained from a result of comparing the first target VOH voltage VTG21 with a voltage of the second node N42. The second code generator 733 includes a second comparator 734 and a second counter 736. The second comparator 734 may be enabled in response to the impedance calibration enable signal ZQEN, may compare the first target VOH voltage VTG21 with the voltage of the second node N42 to output a second comparison signal CS42 and may provide the second comparison signal CS42 to the second counter 736 and the second code storing circuit 738.

The second counter 736 may perform a counting operation in response to the second comparison signal CS42 to generate the pull-down control code PDCD and may perform a counting operation to increase or decrease the pull-down control code PDCD until a logic level of the second comparison signal CS42 transits. The pull-down control code PDCD may be calibrated/changed until first target VOH voltage VTG21 becomes the same as the voltage of the second node N42. The second code storing circuit 738 may store the pull-down control code PDCD when the first target VOH voltage VTG21 becomes the voltage of the second node N42.

The third code generator 723 may generate an additional pull-up control code PUCDA obtained from a result of comparing a second target VOH voltage VTG22 with a voltage of the third node N43. The third code generator 723 includes a third comparator 724 and a third counter 726. The third comparator 724 may be enabled in response to the impedance calibration enable signal ZQEN, may compare the second target VOH voltage VTG22 with the voltage of the third node N43 to output a third comparison signal CS43 and may provide the third comparison signal CS43 to the third counter 726 and the third code storing circuit 728.

The third counter 726 may perform a counting operation in response to the third comparison signal CS43 to generate the additional pull-up control code PUCDA and may perform a counting operation to increase or decrease the additional pull-up control code PUCDA until a logic level of the third comparison signal C43 transits. The additional pull-up control code PUCDA may be calibrated/changed until second target VOH voltage VTG22 becomes the same as the voltage of the third node N43. The third code storing circuit 728 may store the additional pull-up control code PUCDA when the second target VOH voltage VTG22 becomes the voltage of the third node N43.

The impedance calibration circuit 700 may store the pull-up control code PUCD and the pull-down control code PDCD for the first VOH voltage VTG21 and the additional pull-up control code PUCDA for the second VOH voltage VTG22 simultaneously or in parallel. The impedance calibration circuit 700 may perform an impedance calibration operation for the first target VOH voltage VTG21 and an impedance calibration operation for the second target VOH voltage VTG22 simultaneously or in parallel.

Figure 19:
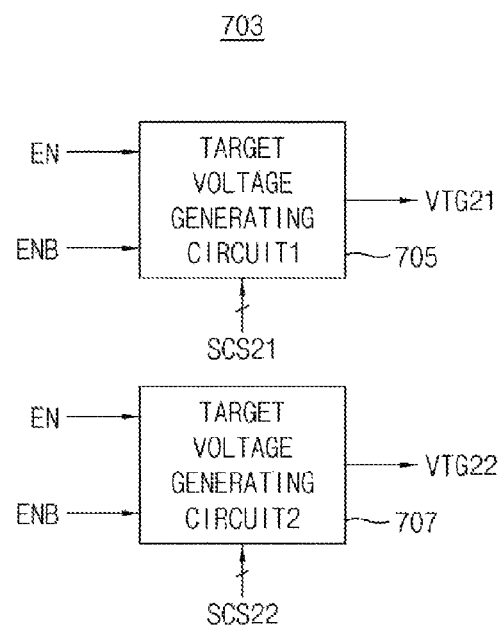
FIG. 19 illustrates a block diagram of the target voltage generator in the impedance calibration circuit of FIG. 18.

FIG. 19 illustrates a block diagram of the target voltage generator in the impedance calibration circuit of FIG. 18.

Referring to FIG. 19, the target voltage generator 703 includes a first target voltage generating circuit 705 and a second target voltage generating circuit 707.

The first target voltage generating circuit 705 may be activated in response to the enable signal EN and the inverted enable signal ENB, and may generate the first target VOH voltage VTG21 in response to a first switching control signal SCS21. The second target voltage generating circuit 707 may be activated in response to the enable signal EN and the inverted enable signal ENB, and may generate the second target VOH voltage VTG22 in response to a second switching control signal SCS22.

Each of the first target voltage generating circuit 705 and the second target voltage generating circuit 707 may have substantially the same configuration as the target voltage generator 410 in FIG. 9. The first switching control signal SCS21 and the second switching control signal SCS22 may be included in the switching control signal SCS in FIG. 18.

Figure 20:
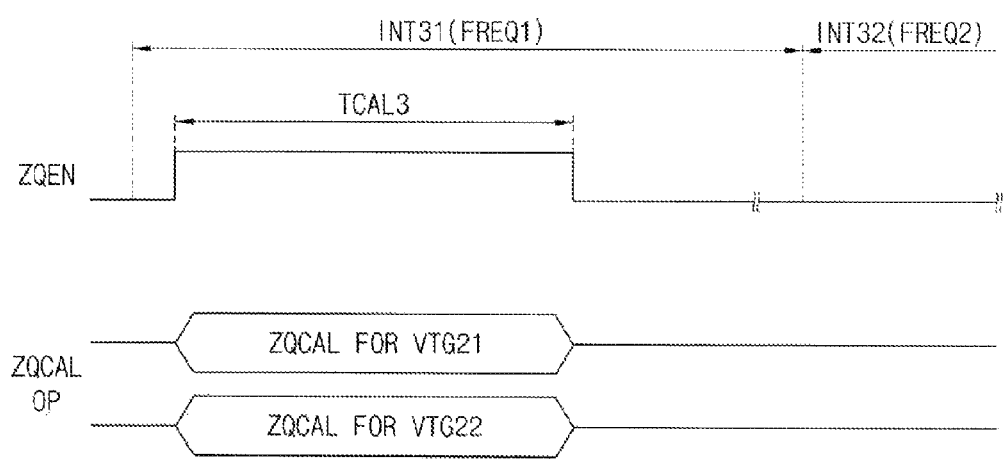
FIG. 20 illustrates a diagram explanatory of an operation of the impedance calibration circuit of FIG. 18.

FIG. 20 illustrates a diagram explanatory of an operation of the impedance calibration circuit of FIG. 18.

Referring to FIGS. 3 through 6, 18 and 20, during a first interval INT31 in which the semiconductor memory device 200*a* operates with a first frequency FREQ1, the mode register 222 activates impedance calibration enable signal ZQEN in response to a first command CMD from the memory controller 100.

During an impedance calibration interval TCAL3 in which the impedance calibration enable signal ZQEN is activated, the impedance calibration circuit 700 of FIG. 18 performs (at ZQCAL FOR VTG21) an impedance calibration operation for the first target VOH voltage VTG21, and stores the pull-up control code PUCD and the pull-down control code PDCD in the first code storing circuit 718 and the second code storing circuit 738, respectively. Simultaneously or in parallel, the impedance calibration circuit 700 performs (at ZQCAL FOR VTG22) an additional impedance calibration operation for the second target VOH voltage VTG22 and stores the additional pull-up control code PUCDA in the third code storing circuit 728.

The data output circuit 320 transmits the data signal DQ to the memory controller 100 based on the pull-up control code PUCD and the pull-down control code PDCD for the first target VOH voltage VTG21 after the impedance calibration interval TCAL3 in the first interval INT31. In addition, the data output circuit 320 transmits the data signal DQ to the memory controller 100 based on the pull-up control code PUCD, the pull-down control code PDCD and the additional pull-up control code PUCDA for the second target VOH voltage VTG22 during the second interval INT32 in which the semiconductor memory device 200a operates with a second voltage FREQ2.

Figure 21:
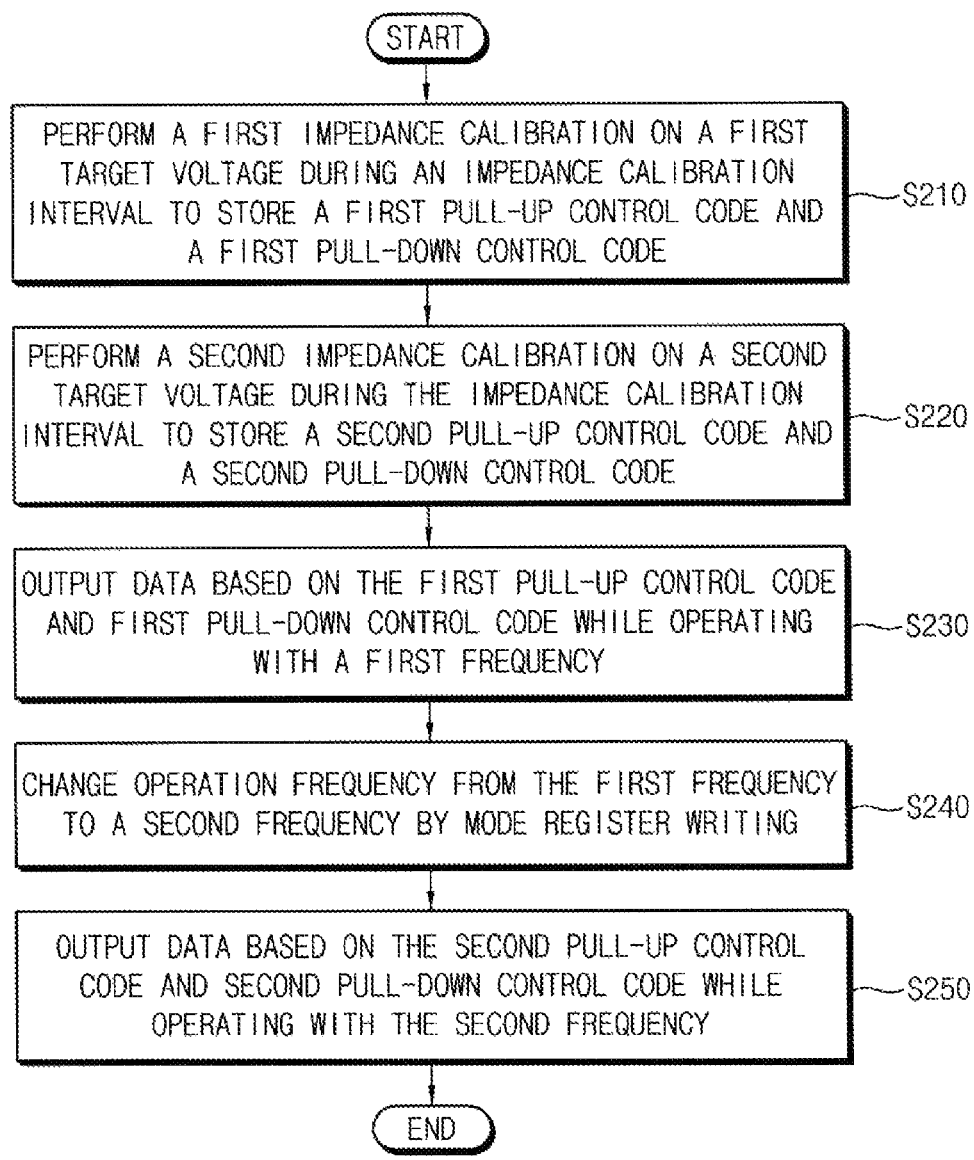
FIG. 21 illustrates a flow chart of a method of operating a semiconductor device according to embodiments of the inventive concept.

FIG. 21 illustrates a flow chart of a method of operating a semiconductor device according to embodiments of the inventive concept.

The method of FIG. 21 may be performed by the semiconductor memory device 200a of FIG. 3.

Referring to FIGS. 2 through 21, in a method of operating a semiconductor memory device 200a, one of the impedance calibration circuits 400, 500, 600 and 700 performs a first impedance calibration operation for the first target VOH voltage VTG1 to store a first pull-up control code PUCD1 and a first pull-down control code PDCD1 during a first impedance calibration interval (S210). The one of the impedance calibration circuits 400, 500, 600 and 700 performs a second impedance calibration operation for the second target VOH voltage VTG2 to store a second pull-up control code PUCD2 and a second pull-down control code PDCD2 during the first impedance calibration interval (S220).

In embodiments of the inventive concept, when one of the impedance calibration circuits 400, 500 and 600 performs the impedance calibration operation, the first impedance calibration operation and the second impedance calibration operation may be performed sequentially respectively in a first impedance calibration interval and a second impedance calibration interval. The first and second impedance calibration intervals are based on different commands.

In other embodiments of the inventive concept, when one of the impedance calibration circuits 400, 500 and 600 performs the impedance calibration operation, the first impedance calibration operation and the second impedance calibration operation may be performed sequentially respectively in a first sub calibration interval and a second sub calibration interval of one impedance calibration interval based on one command.

In other embodiments of the inventive concept, when the impedance calibration circuit 700 performs the impedance calibration operation, the first impedance calibration and the second impedance calibration operation may be performed simultaneously or in parallel in one impedance calibration interval based on one command.

The semiconductor memory device 200a may output the data signal DQ based on the first pull-up control code PUCD1 and the first pull-down control code PDCD1 while the semiconductor memory device 200a operates with the first frequency FREQ1 (S230).

The memory controller 100 changes the operating frequency of the semiconductor memory device 200a from the first frequency FREQ1 to a second frequency FREQ2 by performing a mode register write operation on the mode register 222 (S240). The semiconductor memory device 200a may output the data signal DQ based on the second pull-up control code PUCD2 and the second pull-down control code PDCD2 while the semiconductor memory device 200a operates with the second frequency FREQ2 (S250).

Figure 22:
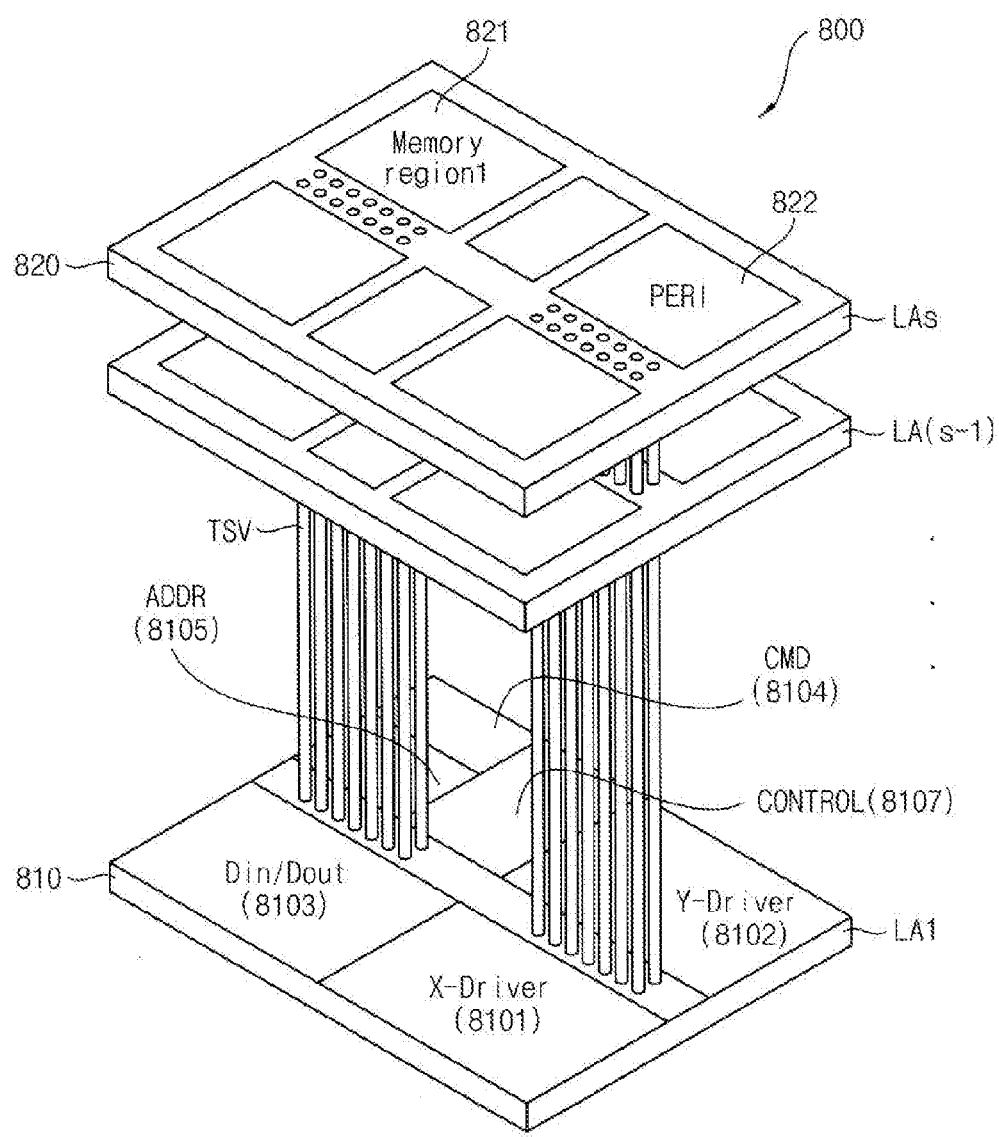
FIG. 22 illustrates a structural diagram of a semiconductor memory device according to embodiments of the inventive concept.

FIG. 22 illustrates a structural diagram of a semiconductor memory device according to embodiments of the inventive concept.

Referring to FIG. 22, a semiconductor memory device 800 includes first through sth semiconductor integrated circuit layers LA1 through LA(s−1), and LAs in which the lowest first semiconductor integrated circuit layer LA1 is assumed to be an interface or control chip and the other semiconductor integrated circuit layers LA2 (not shown) through LAs are assumed to be slave chips including core memory chips. The first through sth semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 800 by mainly using the first semiconductor integrated circuit layer LA1 or 810 as the interface or control chip and the s-th semiconductor integrated circuit layer LAs or 820 as the slave chip.

The first semiconductor integrated circuit layer 810 includes various peripheral circuits for driving a memory region 821 provided in the sth semiconductor integrated circuit layer 820. For example, the first semiconductor integrated circuit layer 810 includes a row (X)-driver 8101 for driving word-lines of a memory, a column (Y)-driver 8102 for driving bit lines of the memory, a data I/O circuit (Din/Dout) 8103 for controlling input/output of data, a command buffer (CMD) 8104 for receiving a command CMD from outside and buffering the command CMD, and an address buffer (ADDR) 8105 for receiving an address from outside and buffering the address. A memory region 821 includes a plurality of memory cells such as described with respect to FIG. 4.

The first semiconductor integrated circuit layer 810 further includes a control logic (CONTROL) 8107. The control logic 8107 may control an access to the memory region 821 based on a command and an address signal from a memory controller.

The s-th semiconductor integrated circuit layer 820 includes the memory region 821 and peripheral circuit regions (PERI) 822 in which peripheral circuits for reading/writing data of the memory region 821, e.g., a row decoder, a column decoder, a bit line sense amplifier, etc. (not illustrated) are arranged.

The data I/O circuit 8103 may employ the I/O circuit 300 of FIG. 5 and one of the impedance calibration circuits 400, 500, 600 and 700 of FIGS. 8, 13, 17 and 18. Therefore, the semiconductor memory device 800 may perform an impedance calibration operation for at least two target VOH voltages, store pull-up control code and pull-down control code pairs during an impedance calibration interval and output data signals using the stored code pairs without performing the impedance calibration operation during a normal memory operation interval as described with reference to FIGS. 2 through 21. Therefore, the semiconductor memory device 800 may increase operating speed and may enhance signal integrity.

In addition, a three dimensional (3D) memory array is provided in semiconductor memory device 800. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 23:
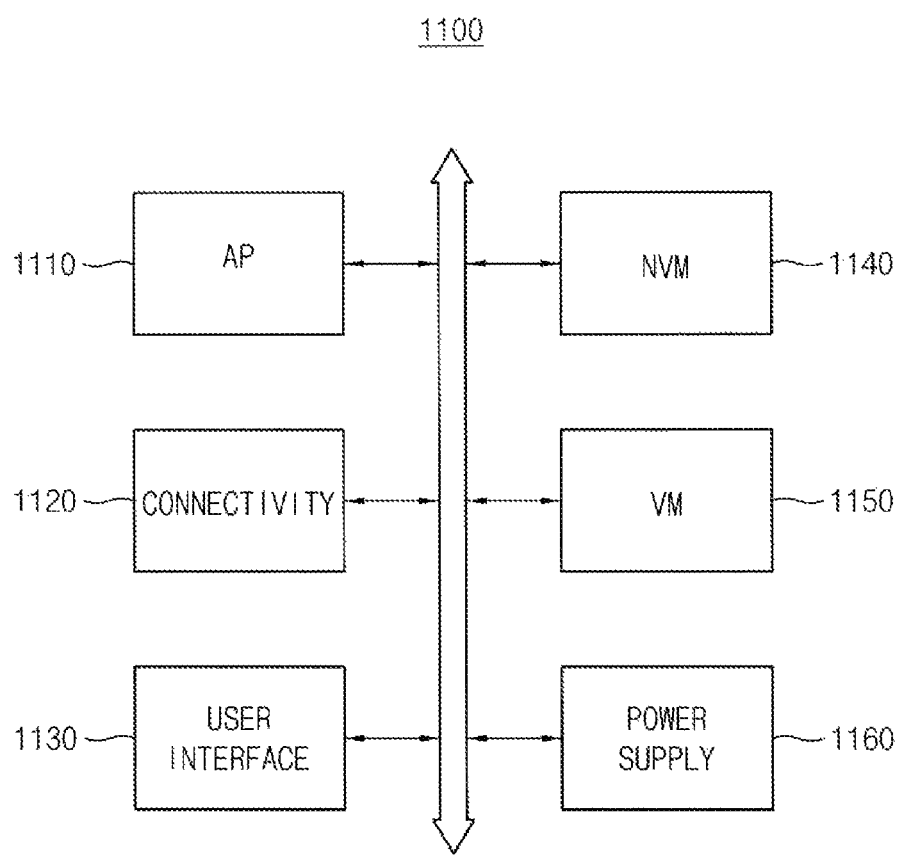
FIG. 23 illustrates a block diagram of a mobile system including the semiconductor memory device according to embodiments of the inventive concept.

FIG. 23 illustrates a block diagram of a mobile system including the semiconductor memory device according to embodiments of the inventive concept.

Referring to FIG. 23, a mobile system 1100 includes an application processor 1110, a connectivity unit 1120, a user interface 1130, a nonvolatile memory device (NVM) 1140, a volatile memory device (VM) 1150 and a power supply 1160.

The application processor 1110 may execute applications, such as for example a web browser, a game application, a video player, or the like. The application processor 1110 may include a single core or multi-core. The connectivity unit 1120 may perform wired or wireless communication with an external device.

The volatile memory device 1150 may for example store data processed by the application processor 1110 or operate as a working memory. The volatile memory device 1150 may employ the semiconductor memory device of FIG. 3. Therefore, the volatile memory device 1150 may include the I/O circuit 300 and one of the impedance calibration circuits 400, 500, 600 and 700 of FIGS. 8, 13, 17 and 18. Therefore, the volatile memory device 1150 may increase operating speed and signal integrity.

The nonvolatile memory device 1140 may for example store a boot image for booting the mobile system 1100. The user interface 1130 may include at least one input device such as for example a keypad, a touch screen, or the like, and at least one output device such as for example a speaker, a display device, or the like. The power supply 1160 may supply a power supply voltage to the mobile system 1100.

In some embodiments of the inventive concept, the mobile system 1100 and/or components of the mobile system 1100 may be packaged in various forms.

The present disclosure may be applied to systems using semiconductor memory devices. The present disclosure may be applied to systems such as for example a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or the like.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the inventive concept. Accordingly, all such modifications are intended to be included within the scope of the present disclosure as defined in the claims.

What is claimed is:

1. An impedance calibration circuit of a semiconductor memory device, the impedance calibration circuit comprising:
   a first code generator configured to generate a pull-up control code obtained from a result of comparing a target output high level (VOH) voltage with a first voltage at a first node between a pull-up driver and a first replica pull-down driver;
   a first code storing circuit configured to store the pull-up control code when the target VOH voltage becomes the same as the first voltage;
   a second code generator configured to generate a pull-down control code obtained from a result of comparing the target VOH voltage with a second voltage at a second node connected to an impedance calibration (ZQ) pad, the ZQ pad connected to an external resistor; and
   a second code storing circuit configured to store the pull-down control code when the target VOH voltage becomes the same as the second voltage,
   wherein the first code storing circuit and the second code storing circuit are configured to respectively store a first pull-up control code as the pull-up control code and a first pull-down control code as the pull-down control code, and to respectively store a second pull-up control code as the pull-up control code and a second pull-down control code as the pull-down control code when the semiconductor memory device operates with a first frequency,
   wherein the first pull-up control code and the first pull-down control code are associated with a first operating parameter of the semiconductor memory device, and
   wherein the second pull-up control code and the second pull-down control code are associated with a second operating parameter of the semiconductor memory device.

2. The impedance calibration circuit of claim 1, wherein the first code generator and the second code generator are configured to respectively generate the first pull-up control code and the first pull-down control code, based on a first command applied from an external memory controller at a first timing, and
   the first code generator and the second code generator are configured to respectively generate the second pull-up control code and the second pull-down control code, based on a second command applied from the external memory controller at a second timing different from the first timing.

3. The impedance calibration circuit of claim 1, wherein the first code generator and the second code generator are configured to respectively generate the first pull-up control code and the first pull-down control code, and to respectively generate the second pull-up control code and the second pull-down control code sequentially after the first pull-up control code and the first pull-down control code, based on a command applied from an external memory controller.

4. The impedance calibration circuit of claim 1, wherein the first code generator comprises:
   a first comparator configured to compare the target VOH voltage with the first voltage to output a first comparison signal; and
   a first counter configured to increase or decrease the pull-up control code in response to the first comparison signal, and wherein the second code generator comprises
a second comparator configured to compare the target VOH voltage with the second voltage to output a second comparison signal; and
a second counter configured to increase or decrease the pull-down control code in response to the second comparison signal.

5. The impedance calibration circuit of claim 4, wherein the first code storing circuit is configured to latch and store the pull-up control code in response to a transition of the first comparison signal and is configured to provide the stored pull-up control code to an output pull-up driver in an output circuit of the semiconductor memory device in response to a register output enable signal and a frequency information signal indicating an operating frequency of the semiconductor memory device, and
wherein the second code storing circuit is configured to latch and store the pull-down control code in response to a transition of the second comparison signal and is configured to provide the stored pull-down control code to an output pull-down driver in the output circuit in response to the register output enable signal and the frequency information signal.

6. The impedance calibration circuit of claim 4, wherein the first code storing circuit comprises:
a first latch circuit configured to latch the first pull-up control code and the second pull-up control code at different timings, in response to a transition of the first comparison signal;
a first register unit comprising at least a first register and a second register, wherein the first register is configured to store the first pull-up control code latched in the first latch circuit and the second register is configured to store the second pull-up control code latched in the first latch circuit; and
a first multiplexer coupled to the first register unit, the first multiplexer is configured to output one of the stored first pull-up control code and the stored second pull-up control code in response to a frequency information signal, and
wherein the second code storing circuit comprises
a second latch circuit configured to latch the first pull-down control code and the second pull-down control code at different timings, in response to a transition of the second comparison signal;
a second register unit comprising at least a third register and a fourth register, wherein the third register is configured to store the first pull-down control code latched in the second latch circuit and the fourth register is configured to store the second pull-down control code latched in the second latch circuit; and
a second multiplexer coupled to the second register unit, the second multiplexer is configured to output one of the stored first pull-down control code and the stored second pull-down control code in response to the frequency information signal.

7. The impedance calibration circuit of claim 1, further comprising:
a target voltage generator configured to generate the target VOH voltage in response to a switching control signal,
wherein the target voltage generator is configured to generate a first target VOH voltage and a second target VOH voltage as the target VOH voltage at different timings in response to the switching control signal,
the first target VOH voltage is associated with the first operating parameter, and
the second target VOH voltage is associated with the second operating parameter.

8. The impedance calibration circuit of claim 1, wherein the first operating parameter at least includes a first voltage and temperature condition associated with a first operating frequency, the second operating parameter at least includes a second voltage and temperature condition associated with a second operating frequency of the semiconductor memory device, and the second operating frequency is different from the first operating frequency.

9. The impedance calibration circuit of claim 1, further comprising:
a third code generator configured to generate an additional pull-up control code obtained from a result of comparing an additional target VOH voltage with a third voltage at a third node between a replica pull-up driver and a second replica pull-down driver; and
a third code storing circuit configured to store the additional pull-up control code when the additional target VOH voltage becomes same as the third voltage.

10. The impedance calibration circuit of claim 9, wherein the first code generator and the third code generator are configured to generate the pull-up control code and the additional pull-up control code in parallel based on a command applied from an external memory controller during an impedance calibration interval.

11. A semiconductor memory device, comprising:
a control logic circuit configured to generate an impedance calibration enable signal and a mode register set signal by decoding a command from an external memory controller;
an impedance calibration circuit configured to generate pull-up control codes and pull-down control codes for different target output high level (VOH) voltages and store the pull-up control codes and the pull-down control codes, in response to the mode register set signal during an impedance calibration interval based on the impedance calibration enable signal; and
a data output circuit configured to output a data signal by driving data based on a first pull-up control code from among the pull-up control codes and a first pull-down control code from among the pull-down control codes while the semiconductor memory device is operating with a first frequency, and configured to output the data signal by driving the data based on a second pull-up control code from among the pull-up control codes and a second pull-down control code from among the pull-down control codes while the semiconductor memory device is operating with a second frequency different from the first frequency.

12. The semiconductor memory device of claim 11, wherein the impedance calibration circuit comprises:
a first code generator configured to generate a pull-up control code of the pull-up control codes obtained from a result of comparing the target VOH voltage with a first voltage at a first node between a pull-up driver and a first replica pull-down driver;
a first code storing circuit configured to store the pull-up control code when the target VOH voltage becomes the same as the first voltage;
a second code generator configured to generate a pull-down control code of the pull-down control codes obtained from a result of comparing the VOH voltage with a second voltage at a second node connected to an impedance calibration (ZQ) pad, the ZQ pad connected to an external resistor; and a second code storing circuit configured to store the pull-down control code when the target VOH voltage becomes the same as the second voltage.

13. The semiconductor memory device of claim 12, wherein the first code storing circuit and the second code storing circuit are configured to respectively store the first pull-up control code and the first pull-down control code and to respectively store the second pull-up control code and the second pull-down control code during the impedance calibration interval in which the semiconductor memory device operates with the first frequency,
wherein the first pull-up control code and the first pull-down control code are associated with a first operating parameter of the semiconductor memory device, and
wherein the second pull-up control code and the second pull-down control code are associated with a second operating parameter of the semiconductor memory device.

14. The semiconductor memory device of claim 12, wherein the first code generator and the second code generator are configured to respectively generate the first pull-up control code and the first pull-down control code, based on a first command applied from the external memory controller at a first timing, and
wherein the first code generator and the second code generator are configured to respectively generate the second pull-up control code and the second pull-down control code, based on a second command applied from the external memory controller at a second timing different from the first timing.

15. The semiconductor memory device of claim 12, wherein the first code generator and the second code generator are configured to respectively generate the first pull-up control code and the first pull-down control code, and to respectively generate the second pull-up control code and the second pull-down control code sequentially after the first pull-up control code and the first pull-down control code, based on the command applied from the external memory controller.

16. The semiconductor memory device of claim 12, wherein the impedance calibration circuit further comprises:
a third code generator configured to generate an additional pull-up control code obtained from a result of comparing an additional target VOH voltage with a third voltage at a third node between a replica pull-up driver and a second replica pull-down driver; and
a third code storing circuit configured to store the additional pull-up control code when the additional target VOH voltage becomes the same as the third voltage,
wherein the first code generator and the third code generator are configured to generate the pull-up control code and the additional pull-up control code in parallel based on the command applied from the external memory controller during the impedance calibration interval.

17. The semiconductor memory device of claim 11, wherein the data output circuit comprises:
a pre-driver configured to receive the data and to generate a pull-up driving signal and a pull-down driving signal based on a pull-up control code from among the pull-up control codes and a pull-down control code from among the pull-down control codes; and
an output driver including an output pull-up driver configured to generate a current determined by the pull-up driving signal and an output pull-down driver configured to have a resistance determined by the pull-down driving signal, wherein the output driver is configured to output the data signal having a target VOH voltage from among the target VOH voltages.

18. The semiconductor memory device of claim 11, further comprising:
a detection circuit configured to determine whether a target VOH voltage from among the target VOH voltages is within a reference range based on a pull-up voltage and a pull-down voltage, and to output a detection signal indicating a result of the determination, wherein the pull-up voltage and the pull-down voltage are provided from the impedance calibration circuit during the impedance calibration interval.

19. The semiconductor memory device of claim 11, further comprising:
a memory cell array configured to store the data and to provide the stored data to the data output circuit,
wherein the memory cell array includes a three dimensional memory cell array.

20. A method of operating a semiconductor memory device, the method comprising:
storing a first pull-up control code and a first pull-down control code by performing an impedance calibration operation on a first target voltage during an impedance calibration interval based on an externally provided command;
storing a second pull-up control code and a second pull-down control code by performing an impedance calibration operation on a second target voltage during the impedance calibration interval;
outputting a data signal based on the first pull-up control code and the first pull-down control code while the semiconductor memory device is operating with a first frequency;
changing an operating frequency of the semiconductor memory device from the first frequency to a second frequency by performing a mode register write operation in the semiconductor memory device; and
outputting the data signal based on the second pull-up control code and the second pull-down control code while the semiconductor memory device is operating with the second frequency.

* * * * *